US012682953B2

(12) United States Patent
Harari

(10) Patent No.: US 12,682,953 B2
(45) Date of Patent: Jul. 14, 2026

(54) MEMORY STRUCTURE INCLUDING THREE-DIMENSIONAL NOR MEMORY STRINGS AND METHOD OF FABRICATION

(71) Applicant: SUNRISE MEMORY CORPORATION, San Jose, CA (US)

(72) Inventor: Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 597 days.

(21) Appl. No.: 18/175,259

(22) Filed: Feb. 27, 2023

(65) Prior Publication Data

US 2023/0282282 A1     Sep. 7, 2023

Related U.S. Application Data

(60) Provisional application No. 63/315,696, filed on Mar. 2, 2022.

(51) Int. Cl.
*G11C 16/04*       (2006.01)
*H10B 43/10*       (2023.01)
       (Continued)

(52) U.S. Cl.
CPC ......... *G11C 16/0483* (2013.01); *H10B 43/10* (2023.02); *H10B 43/27* (2023.02);
       (Continued)

(58) Field of Classification Search
CPC .... G11C 16/0483; H10B 43/10; H10B 43/27; H10D 30/0413; H10D 30/0415; H10D 30/69; H10D 30/701
See application file for complete search history.

(56) References Cited

U.S. PATENT DOCUMENTS 4,213,139 A     7/1980   Rao
4,984,153 A     1/1991   Kregness et al.
       (Continued)

FOREIGN PATENT DOCUMENTS

CN         111799263 A     10/2020
JP        2000339978 A     12/2000
       (Continued)

OTHER PUBLICATIONS

Kim, N. , et al., "Multi-layered Vertical gate NANO Flash Overcoming Stacking Limit for Terabit Density Storage", Symposium on VLSI Tech. Dig. of Technical Papers, 2009, pp. 188-189.
       (Continued)

*Primary Examiner* — Lex H Malsawma
*Assistant Examiner* — Sammantha K Salaz

(57)          ABSTRACT

A memory structure including three-dimensional NOR memory strings and method of fabrication is disclosed. In some embodiments, a memory structure includes randomly accessible storage transistors organized as horizontal NOR memory strings. The NOR memory strings are formed over a semiconductor substrate in multiple scalable memory stacks of thin-film storage transistors. The storage transistors can be charge-trapping type storage transistors or ferroelectric storage transistors. The three-dimensional memory stacks are manufactured in a process that uses a sacrificial layer and access shafts to perform channel separation through a backside selective etch process. In some embodiments, the memory structure includes first and second semiconductor layers and respective first and second conductive layers forming the source and drain regions, which are
       (Continued)

spaced apart by a channel spacer dielectric layer. Each conductive layer is formed between the respective semiconductor layer and the channel spacer dielectric layer.

18 Claims, 24 Drawing Sheets

(51) Int. Cl.

| | | |
|---|---|---|
| H10B 43/27 | (2023.01) | |
| H10D 30/01 | (2025.01) | |
| H10D 30/69 | (2025.01) | |

(52) U.S. Cl.

CPC ..... *H10D 30/0413* (2025.01); *H10D 30/0415* (2025.01); *H10D 30/69* (2025.01); *H10D 30/701* (2025.01)

(56) References Cited

U.S. PATENT DOCUMENTS

| | | | |
|---|---|---|---|
| 5,388,246 | A | 2/1995 | Kasai |
| 5,583,808 | A | 12/1996 | Brahmbhatt |
| 5,646,886 | A | 7/1997 | Brahmbhatt |
| 5,656,842 | A | 8/1997 | Iwamatsu |
| 5,768,192 | A | 6/1998 | Eitan |
| 5,789,776 | A | 8/1998 | Lancaster et al. |
| 5,880,993 | A | 3/1999 | Kramer et al. |
| 5,915,167 | A | 6/1999 | Leedy |
| 6,040,605 | A | 3/2000 | Sano et al. |
| 6,049,497 | A | 4/2000 | Yero |
| 6,057,862 | A | 5/2000 | Margulis |
| 6,118,171 | A | 9/2000 | Davies et al. |
| 6,130,838 | A | 10/2000 | Kim et al. |
| 6,313,518 | B1 | 11/2001 | Ahn et al. |
| 6,314,046 | B1 | 11/2001 | Kamiya et al. |
| 6,362,508 | B1 | 3/2002 | Rasovaky et al. |
| 6,396,744 | B1 | 5/2002 | Wong |
| 6,434,053 | B1 | 8/2002 | Fujiwara |
| 6,580,124 | B1 | 6/2003 | Cleeves et al. |
| 6,587,365 | B1 | 7/2003 | Salling |
| 6,627,503 | B2 | 9/2003 | Ma |
| 6,744,094 | B2 | 6/2004 | Forbes |
| 6,754,105 | B1 | 6/2004 | Chang et al. |
| 6,774,458 | B2 | 8/2004 | Fricke et al. |
| 6,873,004 | B1 | 3/2005 | Han et al. |
| 6,881,994 | B2 | 4/2005 | Lee et al. |
| 7,005,350 | B2 | 2/2006 | Walker et al. |
| 7,177,977 | B2 | 2/2007 | Chen et al. |
| 7,223,653 | B2 | 5/2007 | Cheng et al. |
| 7,307,308 | B2 | 12/2007 | Lee |
| 7,465,980 | B2 | 12/2008 | Arimoto et al. |
| 7,489,002 | B2 | 2/2009 | Forbes et al. |
| 7,512,012 | B2 | 3/2009 | Kuo |
| 7,524,725 | B2 | 4/2009 | Chung |
| 7,542,348 | B1 | 6/2009 | Kim |
| 7,612,411 | B2 | 11/2009 | Walker |
| 7,804,145 | B2 | 9/2010 | Shimizu et al. |
| 7,872,295 | B2 | 1/2011 | Park et al. |
| 7,898,009 | B2 | 3/2011 | Wilson et al. |
| 8,026,521 | B1 | 9/2011 | Or-Bach et al. |
| 8,139,418 | B2 | 3/2012 | Carman |
| 8,178,396 | B2 | 5/2012 | Sinha et al. |
| 8,237,213 | B2 | 8/2012 | Liu |
| 8,242,504 | B2 | 8/2012 | Kim |
| 8,278,183 | B2 | 10/2012 | Lerner |
| 8,304,823 | B2 | 11/2012 | Boescke |
| 8,383,482 | B2 | 2/2013 | Kim et al. |
| 8,395,942 | B2 | 3/2013 | Samachisa et al. |
| 8,604,618 | B2 | 12/2013 | Cooney et al. |
| 8,630,114 | B2 | 1/2014 | Lue |
| 8,743,612 | B2 | 6/2014 | Choi et al. |
| 8,767,436 | B2 | 7/2014 | Scalia et al. |
| 8,767,473 | B2 | 7/2014 | Shim et al. |
| 8,848,425 | B2 | 9/2014 | Schloss |
| 8,878,278 | B2 | 11/2014 | Alsmeier et al. |
| 9,053,801 | B2 | 6/2015 | Sandhu et al. |
| 9,053,802 | B2 | 6/2015 | Mueller |
| 9,190,293 | B2 | 11/2015 | Wang et al. |
| 9,202,694 | B2 | 12/2015 | Konevecki et al. |
| 9,219,225 | B2 | 12/2015 | Karda et al. |
| 9,230,985 | B1 | 1/2016 | Wu et al. |
| 9,231,206 | B2 | 1/2016 | Tao et al. |
| 9,263,577 | B2 | 2/2016 | Ramaswamy et al. |
| 9,281,044 | B2 | 3/2016 | Ramaswamy et al. |
| 9,299,580 | B2 | 3/2016 | Kong et al. |
| 9,337,210 | B2 | 5/2016 | Karda et al. |
| 9,391,084 | B2 | 7/2016 | Lue |
| 9,412,752 | B1 | 8/2016 | Yeh et al. |
| 9,455,268 | B2 | 9/2016 | Oh et al. |
| 9,472,560 | B2 | 10/2016 | Ramaswamy et al. |
| 9,530,794 | B2 | 12/2016 | Ramaswamy et al. |
| 9,620,605 | B2 | 4/2017 | Liang et al. |
| 9,633,944 | B2 | 4/2017 | Kim |
| 9,698,152 | B2 | 7/2017 | Peri |
| 9,711,529 | B2 | 7/2017 | Hu et al. |
| 9,748,172 | B2 | 8/2017 | Takaki |
| 9,786,684 | B2 | 10/2017 | Ramaswamy et al. |
| 9,799,761 | B2 | 10/2017 | Or-Bach et al. |
| 9,818,848 | B2 | 11/2017 | Sun et al. |
| 9,842,651 | B2 | 12/2017 | Harari |
| 9,865,680 | B2 | 1/2018 | Okumura et al. |
| 9,875,784 | B1 | 1/2018 | Li et al. |
| 9,876,018 | B2 | 1/2018 | Chavan et al. |
| 9,892,800 | B2 | 2/2018 | Harari |
| 9,911,497 | B1 | 3/2018 | Harari |
| 9,941,299 | B1 | 4/2018 | Chen et al. |
| 10,014,317 | B2 | 7/2018 | Peng |
| 10,038,092 | B1 | 7/2018 | Chen et al. |
| 10,043,567 | B2 | 8/2018 | Slesazeck et al. |
| 10,056,393 | B2 | 8/2018 | Schroeder et al. |
| 10,074,667 | B1 | 9/2018 | Higashi |
| 10,090,036 | B2 | 10/2018 | Van Houdt |
| 10,096,364 | B2 | 10/2018 | Harari |
| 10,121,553 | B2 | 11/2018 | Harari |
| 10,157,780 | B2 | 12/2018 | Wu et al. |
| 10,211,223 | B2 | 2/2019 | Van Houdt et al. |
| 10,211,312 | B2 | 2/2019 | Van Houdt et al. |
| 10,217,667 | B2 | 2/2019 | Or-Bach et al. |
| 10,249,370 | B2 | 4/2019 | Harari |
| 10,254,968 | B1 | 4/2019 | Gazit et al. |
| 10,283,493 | B1 | 5/2019 | Nishida |
| 10,319,696 | B1 | 6/2019 | Nakano |
| 10,355,121 | B2 | 7/2019 | Or-Bach et al. |
| 10,373,956 | B2 | 8/2019 | Gupta et al. |
| 10,381,370 | B2 | 8/2019 | Shin et al. |
| 10,381,378 | B1 | 8/2019 | Harari |
| 10,395,737 | B2 | 8/2019 | Harari |
| 10,403,627 | B2 | 9/2019 | Van Houdt et al. |
| 10,418,377 | B2 | 9/2019 | Van Houdt et al. |
| 10,424,379 | B2 | 9/2019 | Slesazeck et al. |
| 10,431,596 | B2 | 10/2019 | Herner et al. |
| 10,460,788 | B2 | 10/2019 | Mueller |
| 10,475,812 | B2 | 11/2019 | Harari |
| 10,510,773 | B2 | 12/2019 | Ramaswamy et al. |
| 10,600,808 | B2 | 3/2020 | Schröder et al. |
| 10,608,008 | B2 | 3/2020 | Harari et al. |
| 10,608,011 | B2 | 3/2020 | Harari et al. |
| 10,622,051 | B2 | 4/2020 | Mueller et al. |
| 10,622,377 | B2 | 4/2020 | Harari et al. |
| 10,636,471 | B2 | 4/2020 | Ramaswamy et al. |
| 10,650,892 | B2 | 5/2020 | Noack |
| 10,651,153 | B2 | 5/2020 | Fastow et al. |
| 10,651,182 | B2 | 5/2020 | Morris et al. |
| 10,651,196 | B1 | 5/2020 | Sharangpani et al. |
| 10,692,837 | B1 | 6/2020 | Nguyen et al. |
| 10,692,874 | B2 | 6/2020 | Harari et al. |
| 10,700,093 | B1 | 6/2020 | Kalitsov et al. |
| 10,720,437 | B2 | 7/2020 | Yoo |
| 10,825,834 | B1 | 11/2020 | Chen |
| 10,879,269 | B1 | 12/2020 | Zhang et al. |
| 10,896,711 | B2 | 1/2021 | Lee et al. |
| 10,937,482 | B2 | 3/2021 | Sharma et al. |
| 10,950,616 | B2 | 3/2021 | Harari et al. |

(56) References Cited

U.S. PATENT DOCUMENTS

| | | |
|---|---|---|
| 11,043,280 B1 | 6/2021 | Prakash et al. |
| 11,171,157 B1 | 11/2021 | Lai et al. |
| 11,411,025 B2 | 8/2022 | Lai et al. |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0193484 A1 | 12/2002 | Albee |
| 2003/0038318 A1 | 2/2003 | Forbes |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2004/0264247 A1 | 12/2004 | Kim |
| 2005/0218509 A1 | 10/2005 | Kipnis et al. |
| 2005/0236625 A1 | 10/2005 | Schuele et al. |
| 2005/0280061 A1 | 12/2005 | Lee |
| 2006/0001083 A1 | 1/2006 | Bhattacharyya |
| 2006/0080457 A1 | 4/2006 | Hiramatsu et al. |
| 2006/0155921 A1 | 7/2006 | Gorobets et al. |
| 2006/0212651 A1 | 9/2006 | Ashmore |
| 2006/0261404 A1 | 11/2006 | Forbes |
| 2007/0012987 A1 | 1/2007 | Mcteer |
| 2007/0023817 A1 | 2/2007 | Dao |
| 2007/0045711 A1 | 3/2007 | Bhattacharyya |
| 2007/0134876 A1 | 6/2007 | Lai et al. |
| 2007/0192518 A1 | 8/2007 | Rupanagunta et al. |
| 2008/0022026 A1 | 1/2008 | Yang et al. |
| 2008/0054346 A1 | 3/2008 | Saitoh et al. |
| 2008/0160765 A1 | 7/2008 | Lee et al. |
| 2008/0173930 A1 | 7/2008 | Watanabe |
| 2008/0178794 A1 | 7/2008 | Cho et al. |
| 2008/0212358 A1 | 9/2008 | Mitsui |
| 2008/0239812 A1 | 10/2008 | Naofumi et al. |
| 2008/0266960 A1 | 10/2008 | Kuo |
| 2008/0291723 A1 | 11/2008 | Wang et al. |
| 2008/0301359 A1 | 12/2008 | Smith |
| 2009/0057722 A1 | 3/2009 | Masuoka et al. |
| 2009/0140318 A1 | 6/2009 | Dong |
| 2009/0157946 A1 | 6/2009 | Arya |
| 2009/0237996 A1 | 9/2009 | Kirsch et al. |
| 2009/0242966 A1 | 10/2009 | Son et al. |
| 2009/0268519 A1 | 10/2009 | Ishii |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0013001 A1 | 1/2010 | Cho et al. |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0148215 A1 | 6/2010 | Schulze et al. |
| 2010/0207185 A1 | 8/2010 | Lee et al. |
| 2010/0213527 A1 | 8/2010 | Shim et al. |
| 2010/0219392 A1 | 9/2010 | Awaya et al. |
| 2010/0254191 A1 | 10/2010 | Son et al. |
| 2010/0327413 A1 | 12/2010 | Lee et al. |
| 2011/0003418 A1 | 1/2011 | Sakata et al. |
| 2011/0044113 A1 | 2/2011 | Kim |
| 2011/0047325 A1 | 2/2011 | Mishima |
| 2011/0115011 A1 | 5/2011 | Masuoka et al. |
| 2011/0134705 A1 | 6/2011 | Jones et al. |
| 2011/0143519 A1 | 6/2011 | Lerner |
| 2011/0170266 A1 | 7/2011 | Haensh et al. |
| 2011/0291176 A1 | 12/2011 | Lee et al. |
| 2011/0298013 A1 | 12/2011 | Hwang et al. |
| 2011/0310683 A1 | 12/2011 | Gorobets |
| 2012/0063223 A1 | 3/2012 | Lee |
| 2012/0064682 A1* | 3/2012 | Jang ..................... H10B 43/10 |
| | | 257/E21.645 |
| 2012/0146126 A1 | 6/2012 | Lai et al. |
| 2012/0182801 A1 | 7/2012 | Lue |
| 2012/0208347 A1 | 8/2012 | Hwang et al. |
| 2012/0223380 A1 | 9/2012 | Lee et al. |
| 2012/0243314 A1 | 9/2012 | Takashi |
| 2012/0307568 A1 | 12/2012 | Banna et al. |
| 2012/0327714 A1 | 12/2012 | Lue |
| 2013/0031325 A1 | 1/2013 | Nakamoto et al. |
| 2013/0126957 A1 | 5/2013 | Higashitani et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0070289 A1 | 3/2014 | Tanaka et al. |
| 2014/0075135 A1 | 3/2014 | Choi et al. |
| 2014/0112075 A1 | 4/2014 | Dunga et al. |
| 2014/0117366 A1 | 5/2014 | Saitoh |
| 2014/0151774 A1 | 6/2014 | Rhie |
| 2014/0173017 A1 | 6/2014 | Takagi et al. |
| 2014/0213032 A1 | 7/2014 | Kai et al. |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0194440 A1 | 7/2015 | Noh et al. |
| 2015/0220463 A1 | 8/2015 | Fluman et al. |
| 2015/0249143 A1 | 9/2015 | Sano |
| 2015/0263005 A1 | 9/2015 | Zhao et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0086970 A1 | 3/2016 | Peng |
| 2016/0118404 A1 | 4/2016 | Peng |
| 2016/0141294 A1 | 5/2016 | Peri et al. |
| 2016/0225860 A1 | 8/2016 | Karda et al. |
| 2016/0276360 A1 | 9/2016 | Doda et al. |
| 2016/0300724 A1 | 10/2016 | Levy et al. |
| 2016/0314042 A1 | 10/2016 | Plants |
| 2016/0321002 A1 | 11/2016 | Jung et al. |
| 2016/0358934 A1 | 12/2016 | Lin et al. |
| 2017/0053906 A1 | 2/2017 | Or-Bach et al. |
| 2017/0062456 A1 | 3/2017 | Sugino et al. |
| 2017/0092370 A1 | 3/2017 | Harari |
| 2017/0092371 A1 | 3/2017 | Harari |
| 2017/0140807 A1 | 5/2017 | Sun et al. |
| 2017/0148517 A1 | 5/2017 | Harari |
| 2017/0148810 A1 | 5/2017 | Kai et al. |
| 2017/0194341 A1 | 7/2017 | Yamada |
| 2017/0213731 A1 | 7/2017 | Yoon et al. |
| 2017/0213821 A1 | 7/2017 | Or-Bach et al. |
| 2017/0358594 A1 | 12/2017 | Lu et al. |
| 2018/0095127 A1 | 4/2018 | Pappu et al. |
| 2018/0108416 A1 | 4/2018 | Harari |
| 2018/0151419 A1 | 5/2018 | Wu et al. |
| 2018/0261613 A1 | 9/2018 | Ariyoshi et al. |
| 2018/0269229 A1 | 9/2018 | Or-Bach et al. |
| 2018/0286918 A1 | 10/2018 | Bandyopadhyay et al. |
| 2018/0314635 A1 | 11/2018 | Alam |
| 2018/0330791 A1 | 11/2018 | Li et al. |
| 2018/0331042 A1 | 11/2018 | Manusharow et al. |
| 2018/0342455 A1 | 11/2018 | Nosho et al. |
| 2018/0342544 A1 | 11/2018 | Lee et al. |
| 2018/0366471 A1 | 12/2018 | Harari et al. |
| 2018/0366485 A1 | 12/2018 | Harari |
| 2018/0366489 A1 | 12/2018 | Harari et al. |
| 2018/0374929 A1 | 12/2018 | Yoo |
| 2019/0006009 A1 | 1/2019 | Harari |
| 2019/0006015 A1 | 1/2019 | Norman et al. |
| 2019/0019564 A1 | 1/2019 | Li et al. |
| 2019/0067327 A1 | 2/2019 | Herner et al. |
| 2019/0148286 A1 | 5/2019 | Or-Bach et al. |
| 2019/0157296 A1 | 5/2019 | Harari et al. |
| 2019/0180821 A1 | 6/2019 | Harari |
| 2019/0198509 A1 | 6/2019 | Kim |
| 2019/0206890 A1 | 7/2019 | Harari et al. |
| 2019/0214077 A1 | 7/2019 | Oh et al. |
| 2019/0237470 A1 | 8/2019 | Mine et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |

(56) References Cited

U.S. PATENT DOCUMENTS

| | | |
|---|---|---|
| 2019/0304988 A1 | 10/2019 | Dong et al. |
| 2019/0319044 A1 | 10/2019 | Harari |
| 2019/0325945 A1 | 10/2019 | Linus |
| 2019/0325964 A1 | 10/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0006376 A1 | 1/2020 | Makala et al. |
| 2020/0020718 A1 | 1/2020 | Harari et al. |
| 2020/0051990 A1 | 2/2020 | Harari et al. |
| 2020/0063263 A1 | 2/2020 | Yang et al. |
| 2020/0075631 A1 | 3/2020 | Dong |
| 2020/0098738 A1 | 3/2020 | Herner et al. |
| 2020/0098779 A1 | 3/2020 | Cernea et al. |
| 2020/0098881 A1 | 3/2020 | Vellianitis |
| 2020/0176468 A1 | 6/2020 | Herner et al. |
| 2020/0201718 A1 | 6/2020 | Richter et al. |
| 2020/0203378 A1 | 6/2020 | Harari et al. |
| 2020/0219572 A1 | 7/2020 | Harari |
| 2020/0227123 A1 | 7/2020 | Salahuddin et al. |
| 2020/0243486 A1 | 7/2020 | Quader et al. |
| 2020/0258897 A1* | 8/2020 | Yan ..................... H01L 21/2251 |
| 2020/0350234 A1 | 11/2020 | Shan et al. |
| 2020/0350324 A1 | 11/2020 | Hoffman |
| 2020/0357453 A1 | 11/2020 | Slesazeck et al. |
| 2020/0357455 A1 | 11/2020 | Noack et al. |
| 2020/0357470 A1 | 11/2020 | Noack |
| 2020/0357822 A1* | 11/2020 | Chen ..................... G11C 11/223 |
| 2020/0365609 A1* | 11/2020 | Harari ..................... G11C 5/06 |
| 2020/0388313 A1 | 12/2020 | Cho et al. |
| 2020/0388711 A1 | 12/2020 | Doyle et al. |
| 2020/0403002 A1 | 12/2020 | Harari |
| 2020/0411533 A1 | 12/2020 | Alsmeier et al. |
| 2021/0005238 A1 | 1/2021 | Mueller |
| 2021/0013224 A1 | 1/2021 | Purayath et al. |
| 2021/0020659 A1 | 1/2021 | Chen |
| 2021/0066502 A1 | 3/2021 | Karda et al. |
| 2021/0074725 A1 | 3/2021 | Lue |
| 2021/0074726 A1 | 3/2021 | Lue |
| 2021/0111179 A1 | 4/2021 | Shivaraman et al. |
| 2021/0175251 A1 | 6/2021 | Zhang et al. |
| 2021/0242241 A1* | 8/2021 | Rajashekhar .......... H10B 41/10 |
| 2021/0247910 A1 | 8/2021 | Kim et al. |
| 2021/0248094 A1 | 8/2021 | Norman et al. |
| 2021/0265308 A1 | 8/2021 | Norman et al. |
| 2021/0320182 A1 | 10/2021 | Chien et al. |
| 2021/0375933 A1 | 12/2021 | Lu et al. |
| 2021/0407600 A1 | 12/2021 | Cariello |
| 2021/0407845 A1* | 12/2021 | Wang ..................... H10B 43/10 |
| 2022/0005830 A1 | 1/2022 | Wu et al. |
| 2022/0028876 A1 | 1/2022 | Purayath et al. |
| 2022/0028886 A1 | 1/2022 | Pur et al. |
| 2022/0028894 A1 | 1/2022 | Yang et al. |
| 2022/0059549 A1* | 2/2022 | Lai .......................... H10B 51/40 |
| 2022/0084564 A1 | 3/2022 | Choi et al. |
| 2022/0139933 A1 | 5/2022 | Noack |
| 2022/0231049 A1 | 7/2022 | Lin et al. |
| 2022/0254390 A1 | 8/2022 | Gans et al. |
| 2022/0351776 A1 | 11/2022 | Nam et al. |
| 2022/0367479 A1 | 11/2022 | Lee et al. |
| 2022/0384459 A1 | 12/2022 | Lu et al. |
| 2022/0393031 A1 | 12/2022 | Ando et al. |
| 2023/0052477 A1 | 2/2023 | Ha et al. |
| 2023/0143057 A1 | 5/2023 | Hoang et al. |
| 2023/0209835 A1* | 6/2023 | Wu .......................... H10B 41/23 |
| | | 257/295 |

FOREIGN PATENT DOCUMENTS

| | | | |
|---|---|---|---|
| JP | 2004079606 A | 3/2004 | |
| JP | 2006099827 A1 | 4/2006 | |
| JP | 2009206451 A1 | 9/2009 | |
| JP | 2010108522 A1 | 5/2010 | |
| JP | 2010251572 A | 11/2010 | |
| JP | 2011028540 A1 | 2/2011 | |
| KR | 20120085591 A1 | 8/2012 | |
| KR | 20120085603 A | 8/2012 | |
| WO | 2016018412 A1 | 2/2016 | |
| WO | 2018236937 A1 | 12/2018 | |
| WO | 2019066948 A1 | 4/2019 | |
| WO | 2021141612 A1 | 7/2021 | |

OTHER PUBLICATIONS

Lee, Sang Yeol, "Comprehensive Review on Amorphous Oxide Semiconductor Thin Film Transistor", Trans. Electr. Electron. Mater. 21, https://doi.org/10.1007/s42341-020-00197-w, Mar. 28, 2020, pp. 235-248.

Lee, Chea-Young , et al., "Etching Characteristics and Changes in Surface Properties of IGZO Thin Films by O2 Addition in CF4/Ar Plasma", Coatings. 2021, 11(8):906. https://doi.org/10.3390/coatings11080906, Jul. 29, 2021.

Liao, P.J. , et al., "Characterization of Fatigue and Its Recovery Behavior in Ferroelectric HfZrO", 2021 Symposium on VLSI Technology, Jun. 2021, 2 p.

Liao, C.Y. , et al., "Multibit Ferroelectric FET Based on Nonidentical Double HfZrO2 for High-Density Nonvolatile Memory", IEEE Electron Device Letters, vol. 42, No. 4, doi: 10.1109/LED.2021. 3060589., Apr. 2021, pp. 617-620.

Lue, H.T. , et al., "A Highly Scalable 8- Layer 3D Vertical-gate {VG} TFT NANO Flash Using Junction-Free Buried Channel BE-SONOS Device", Symposium on VLSI: Tech. Dig. of Technical Papers, 2010, pp. 131-132.

Materano, Monica , et al., "Interplay between oxygen defects and dopants: effect on structure and performance of HfO2-based ferroelectrics", Inorg. Chem. Front. (8), Apr. 9, 2021, pp. 2650-2672.

McBriarty, Martin E., et al., "Crystal Phase Distribution and Ferroelectricity in Ultrathin HfO2—ZrO2 Bilayers", Phys. Status Solidi B, 257: 1900285. https://doi.org/10.1002/pssb.201900285, 8/21/82019, pp. 1-25.

Mittmann, T. , et al., "Impact of Oxygen Vacancy Content in Ferroelectric HZO films on the Device Performance", 2020 IEEE International Electron Devices Meeting (IEDM), doi: 10.1109/IEDM13553.2020.9372097., 2020, pp. 18.4.1-18.4.4.

Yang, Jin , et al., "Highly Optimized Complementary Inverters Based on p—SnO and n—InGaZnO With High Uniformity", IEEE Electron Device Letters, vol. 39, No. 4, doi: 10.1109/LED.2018. 2809796., Apr. 2018, pp. 516-519.

Mo, Fei , et al., "Low-Voltage Operating Ferroelectric FET with Ultrathin IGZO Channel for High-Density Memory Application", IEEE Journal of the Electron Devices Society, vol. 8, doi: 10.1109/JEDS.2020.3008789., Jul. 13, 2020, pp. 717-723.

Mueller, S. , et al., "Development Status of Gate-First FeFET Technology", 2021 Symposium on VLSI Technology, Jun. 2021, 2 pages.

Mueller, J. , et al., "Ferroelectric Hafnium Oxide Based Materials and Devices: Assessment of Current Status and Future Prospects", ECS Journal of Solid State Science and Technology, 4 (5) N30-N35 (2015), Feb. 21, 2015, pp. N29-N35.

Mueller, J. , et al., "Ferroelectric hafnium oxide: A CMOS-compatible and highly scalable approach to future ferroelectric memories", IEEE International Electron Devices Meeting, Washington, DC, USA, doi: 10.1109/IEDM.2013.6724605., 2013, pp. 10.8.1-10.8.4.

Mueller, Stephen , et al., "From MFM Capacitors Toward Ferroelectric Transistors: Endurance and Disturb Characteristics of HfO2-Based FeFET Devices", IEEE Transactions on Electron Devices, vol. 60, No. 12, doi: 10.1109/TED.2013.2283465., Dec. 2013, pp. 4199-4205.

Wu, Jixuan , et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, HI, USA, Jun. 2020, 4 pages.

Nguyen, Manh-Cuong , et al., "Wakeup-Free and Endurance-Robust Ferroelectric Field-Effect Transistor Memory Using High

(56) References Cited

OTHER PUBLICATIONS

Pressure Annealing", IEEE Electron Device Letters, vol. 42, No. 9, doi: 10.1109/LED.2021.3096248., Sep. 2021, pp. 1295-1298.

On, Nuri , et al., "Boosting carrier mobility and stability in indium-zinc-tin oxide thin-film transistors through controlled crystallization", Sci Rep 10, 18868, https://doi.org/10.1038/s41598-020-76046-w, 2020, 16 pages.

Onaya, Takashi , et al., "Improvement in ferroelectricity of HfxZr1—xO2 thin films using top- and bottom-ZrO2 nucleation layers", APL Materials 7, 061107; https://doi.org/10.1063/1.5096626, 2019, pp. 1-8.

Onuki, Tatsuya , et al., "Embedded memory and ARM Cortex-M0 core using 60-nm C-axis aligned crystalline indium-gallium-zinc oxide FET integrated with 65-nm Si CMOS", IEEE Journal of Solid-State Circuits, vol. 52, No. 4,, Apr. 2017, pp. 925-932.

Park, Goon-Ho , et al., "Electrical Characteristics of SiO2/High-k Dielectric Stacked Tunnel Barriers for Nonvolatile Memory Applications", Journal of the Korean Physical Society, vol. 55, No. 1, Jul. 2009, pp. 116-119.

Park, Min Hyuk, et al., "Review of defect chemistry in fluorite-structure ferroelectrics for future electronic devices", J. Mater. Chem. C, vol. 8, No. 31 10526-10550, Jun. 9, 2020., Aug. 21, 2020, pp. 10526-10550.

Rios, Rafael , et al., "A Physically Based Compact Model for IGZO Transistors", IEEE Transactions on Electron Devices, vol. 68, No. 4, doi: 10.1109/TED.2021.3059387., Apr. 2021, pp. 1664-1669.

Rzehak, Volker , "Low-Power FRAM Microcontrollers and Their Applications", Texas Instruments White Paper, SLAA502, Jul. 2019, 7 pages.

Saitoh, Masumi , et al., "HfO2-based FeFET and FTJ for Ferroelectric-Memory Centric 3D LSI towards Low-Power and High-Density Storage and AI Applications", 2020 IEEE International Electron Devices Meeting (IEDM), doi: 10.1109/IEDM13553.2020.9372106., 2020, pp. 18.1.1-18.1.4.

Salahuddin, Sayeef , et al., "FeFETs for Near-Memory and In-Memory Compute", 2021 IEEE International Electron Devices Meeting (IEDM), Department of Electrical Engineering and Computer Sciences, Dec. 2021, 4 pages.

Sato, Yuta , et al., "Source/Drain Contact Engineering of InGaZnO Channel BEOL Transistor for Low Contact Resistance and Suppressing Channel Shortening Effect,", 20th International Workshop on Junction Technology (IWJT), doi: 10.23919/IWJT52818.2021.9609366., 2021, 3 pages.

Sharma, Abhishek A., et al., "High Speed Memory Operation in Channel-Last, Back-gated Ferroelectric Transistors", IEEE International Electron Devices Meeting (IEDM), doi: 10.1109/IEDM13553.2020.9371940., 2020, pp. 18.5.1-18.5.4.

Sheng, Jiazhen , et al., "Review Article: Atomic layer deposition for oxide semiconductor thin film transistors: Advances in research and development", J. Vac. Sci. Technol. A 36, 060801, https://doi.org/10.1116/1.5047237., Nov. 2, 2018, 14 pages.

Wann, H.C. , et al., "High-Endurance Ultra-Thin Tunnel Oxide in Monos Device Structure for Dynamic Memory Application", IEEE Electron Device letters, vol. 16, No. 11, Nov. 1995, pp. 491-493.

Si, Mengwei , et al., "Why In2O3 Can Make 0.7 nm Atomic Layer Thin Transistors?", available at https://arxiv.org/ftp/arxiv/papers/2012/2012.12433.pdf, School of Electrical and Computer Engineering and Birck Nanotechnology Center, Purdue University, West Lafayette, IN 47907, United States, 2012, pp. 1-26.

Su, Nai-Chao , et al., "A Nonvolatile InGaZnO Charge-Trapping-Engineered Flash Memory With Good Retention Characteristics", IEEE Electron Device Letters, vol. 31, No. 3, Mar. 2010, pp. 201-203.

Sun, Chen , "First Demonstration of BEOL-Compatible Ferroelectric TCAM Featuring a-IGZO Fe—TFTs with Large Memory Window of 2.9 V, Scaled Channel Length of 40 nm, and High Endurance of 10^8 Cycles", 2021 Symposium on VLSI Technology Digest of Technical Papers, Kyoto, doi: 978-4-86348-779-6., Jun. 2021, 2 pages.

Tan, Ava J., et al., "A Nitrided Interfacial Oxide for Interface State Improvement in Hafnium Zirconium Oxide-Based Ferroelectric Transistor Technology", IEEE Electron Device Letters, vol. 39, No. 1, doi: 10.1109/LED.2017.2772791., Jan. 2018, pp. 95-98.

Tan, Ava J., et al., "Experimental Demonstration of a Ferroelectric HfO2-Based Content Addressable Memory Cell", EEE Electron Device Letters, vol. 41, No. 2, doi: 10.1109/LED.2019.2963300., Feb. 2020, pp. 240-243.

Tan, Ava Jiang, et al., "Ferroelectric HfO2 Memory Transistors with High-κ Interfacial Layer and Write Endurance Exceeding 1010 Cycles", arXiv:2103.08806 [physics.app-ph], available at https://arxiv.org/abs/2103.08806., Mar. 16, 2021.

Tan, Ava J., et al., "Hot Electrons as the Dominant Source of Degradation for Sub-5nm HZO FeFETs", IEEE Symposium on VLSI Technology, Honolulu, HI, USA, doi: 10.1109/VLSITechnology18217.2020.9265067., 2020, pp. 1-2.

Tan, Yan-Ny , et al., "Over-Erase Phenomenon in SONOS-Type Flash Memory and its Minimization Using a Hafnium Oxide Charge Storage Layer", IEEE Transactions on Electron Devices, vol. 51, No. 7, Jul. 2004, pp. 1143-1147.

Tanaka, T. , et al., "A 768 GB 3b/cell 3D-Floaling-Gate NANO Flash Memory", Digest of Technical Papers, the 2016 EEE International Solid-Slate Circuits Conference, 2016, pp. 142-144.

Van Houdt, Jan , "The 3D FeFET: contender for 3D-NAND Flash memory and machine learning", available at https://www.imec-int.com/en/imec-magazine/imec-magazine-october-2017/the-vertical-ferroelectric-fet-a-new-contender-for-3d-nand-flash-memory-and-machine-learning, Sep. 30, 2019, 8 pages.

Wang, Chin-I , et al., "Atomic layer deposited TiN capping layer for sub-10 nm ferroelectric Hf0.5Zr0.5O2 with large remnant polarization and low thermal budget", Applied Surface Science, vol. 570, 2021, 151152, ISSN 0169-4332, https://doi.org/10.1016/j.apsusc.2021.151152., Aug. 9, 2021, pp. 1-8.

M. O'Connor et al., "Fine-Grained DRAM: Energy-Efficient DRAM for Extreme Bandwidth Systems," 2017 50th Annual IEEE/ACM International Symposium on Microarchitecture (MICRO), Boston, MA, USA, 2017, pp. 41-54.

PCT Search Report and Written Opinion PCT/US2023/010501, dated Jun. 29, 2023.

"EP Extended Search Report EP168690149.3", Oct. 18, 2019.

"European Search Report, EP 16852238.1", Mar. 28, 2019.

"European Search Report, EP17844550.8", Aug. 12, 2020, 11 pages.

"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.

"Invitation to Pay Additional Fees (PCT/ISA/206), PCT/US2020/015710", Mar. 20, 2020, 2 pages.

"Invitation to Pay Additional Fees, PCT/US2019/065256", Feb. 13, 2020, 2 pages.

"Notification of Reasons for Refusal, Japanese Patent Application 2018-527740", (English translation), Nov. 4, 2020, 8 pages.

"Partial European Search Report EP 16869049.3", Jul. 1, 2019, pp. 1-12.

"PCT Search Report and Written Opinion, PCT/US2018/038373", Sep. 10, 2018.

"PCT Search Report and Written Opinion, PCT/US2018/067338", May 8, 2019.

"PCT Search Report and Written Opinion, PCT/US2019/014319", Apr. 15, 2019.

"PCT Search Report and Written Opinion, PCT/US2019/041678", Oct. 9, 2019.

"PCT Search Report and Written Opinion, PCT/US2019/052164", Feb. 27, 2020.

"PCT Search Report and Written Opinion, PCT/US2019/052446", Dec. 11, 2019.

"PCT Search Report and Written Opinion, PCT/US2019/065256", Apr. 14, 2020.

"PCT Search Report and Written Opinion, PCT/US2020/015710", Jun. 9, 2020.

"PCT Search Report and Written Opinion, PCT/US2020/017494", Jul. 20, 2020, 13 pages.

(56)　　　　References Cited

OTHER PUBLICATIONS

"PCT Search Report and Written Opinion, PCT/US2020/065374", Mar. 15, 2021, 17 pages.

"PCT Search Report and Written Opinion, PCT/US2021/016964", Jun. 15, 2021, 19 pages.

"PCT Search Report and Written Opinion, PCT/US2021/025722", Jun. 15, 2021, 10 pages.

"PCT Search Report and Written Opinion, PCT/US2021/042607", Nov. 4, 2021, 17 pages.

"PCT Search Report and Written Opinion, PCT/US2021/42620", Oct. 28, 2021, 18 pages.

"PCT Search Report and Written Opinion, PCT/US2022/016729", Applicant: SunRise Memory Corporation, May 17, 2022, 20 pages.

"PCT Search Report and Written Opinion, PCT/US2022/039473", Dec. 6, 2022, 14 pages.

Ahn, Min-Ju , et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.

Alessandri, Cristobal , et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.

Ali, T. , et al., "A Multilevel FeFET Memory Device based on Laminated HSO and HZO Ferroelectric Layers for High-Density Storage", IEEE International Electron Devices Meeting (IEDM), 2019, doi: 10.1109/ EDM19573.2019.8993642., Dec. 2019, pp. 28.7.1-28.7.4.

Ali, T., et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.—paper cited in Bae (Berkeley) paper, Sep. 2018, pp. 3769-3774.

Bae, Jong-Ho , et al., "Highly Scaled, High Endurance, Ω-Gate, Nanowire Ferroelectric FET Memory Transistors", EEE Electron Device Letters, vol. 41, No. 11, doi: 10.1109/LED.2020.3028339.—Sayeef-Berkeley paper on FeFET memory, Nov. 2020, pp. 1637-1640.

Böscke, T.S. , et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.

Chan, Chi-Yu , et al., "FeFET Memory Featuring Large Memory Window and Robust Endurance of Long-Pulse Cycling by Interface Engineering using High-κ AlON", 2020 IEEE Symposium on VLSI Technology, doi: 10.1109/VLSITechnology18217.2020.9265103., 2020, pp. 1-2.

Chang, Sou-Chi , et al., "Anti-ferroelectric HfxZr1—x02 Capacitors for High-density 3-D Embedded-DRAM", IEEE International Electron Devices Meeting (IEDM), doi: 10.1109/IEDM13553.2020.9372011., 2020, pp. 28.1.1-28.1.4.

Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.

Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.

Choi, Seonjun , et al., "A novel three-dimensional NAND flash structure for improving the erase performance", EICE Electronics Express, 2019 vol. 16 Issue 3, 2019, 6 pages.

Dünkel , "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.

Dutta, Sourav , et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.

Florent, K. , "First demonstration of vertically stacked ferroelectric Al doped HfO2 devices for NAND applications", Symposium on VLSI Technology, doi: 10.23919/VLSIT.2017.7998162., 2017, pp. T158-T159.

Florent, K. , et al., "Vertical Ferroelectric HfO2 FET based on 3-D NAND Architecture: Towards Dense Low-Power Memory", IEEE International Electron Devices Meeting (IEDM), San Francisco, CA, 2018, doi: 10.1109/IEDM.2018.8614710., 2018, p. 2.5.1-2.5.4.

Hendy, Ian , "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.

Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

Hsain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.

Jeewandara, Thamarasee , et al., "High-speed 3-D memory with ferroelectric NAND flash memory", available at https://techxplore.com/news/2021-01-high-speed-d-memoryferroelectric-nand.html, Jan. 26, 2021, 5 pages.

Kim, Min-Kyu , et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material—use IZO for channel), Jan. 13, 2021, 10.

Kim, Taeho , et al., "Effects of high pressure nitrogen annealing on ferroelectric Hf0.5Zr0.502 films", Appl. Phys. Lett. 112, 092906 https://doi.org/10.1063/1.5003369, Mar. 2, 2018, 5 pages.

* cited by examiner

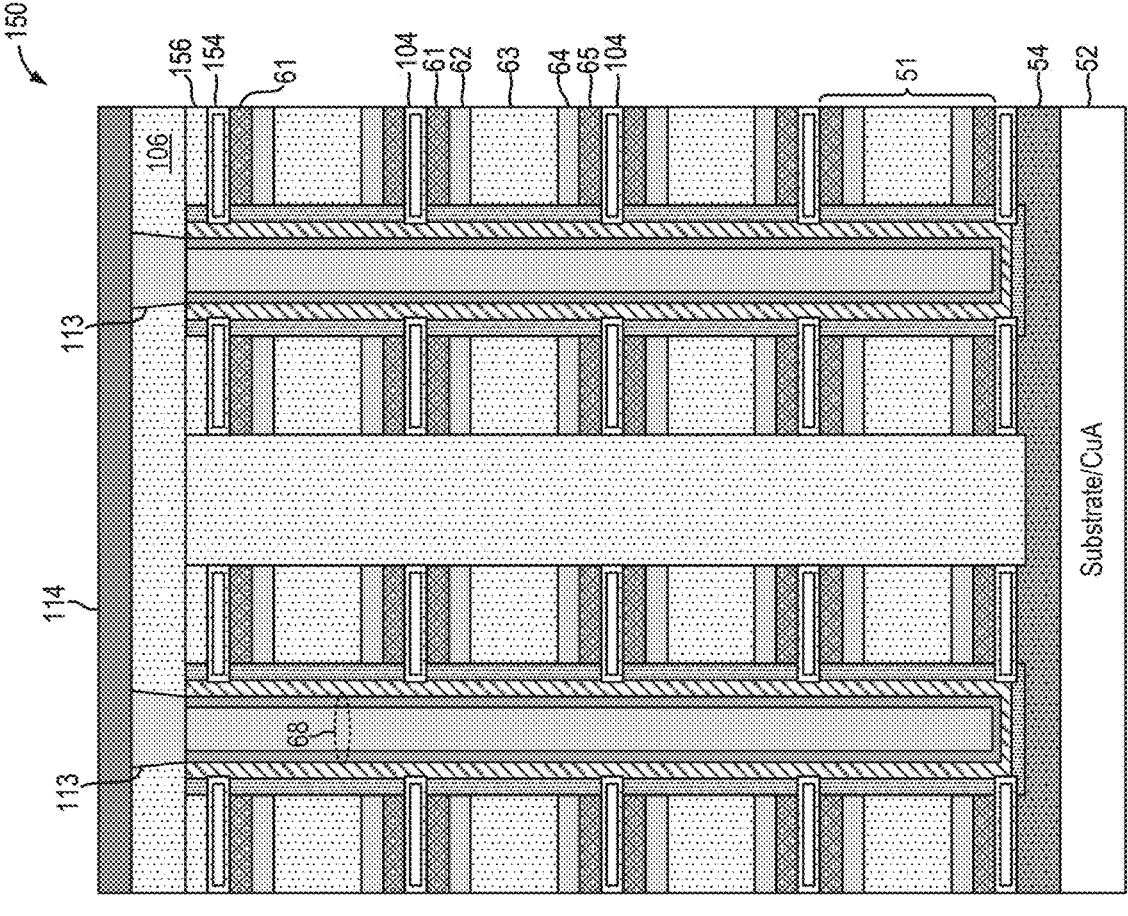
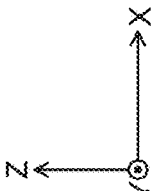
FIG. 3

MEMORY STRUCTURE INCLUDING THREE-DIMENSIONAL NOR MEMORY STRINGS AND METHOD OF FABRICATION

CROSS REFERENCE TO RELATED APPLICATIONS

This application claims priority to U.S. Provisional Patent Application No. 63/315,696, entitled MEMORY STRUC- TURE INCLUDING THREE-DIMENSIONAL NOR MEMORY STRINGS AND METHOD OF FABRICA- TION, filed Mar. 2, 2022, which is incorporated herein by reference in its entirety for all purposes.

FIELD OF THE INVENTION

The invention relates to high-density memory structures, and in particular, the present invention relates to high- density, low read-latency memory structures formed by interconnected thin-film storage elements (e.g., 3-dimen- sional array of thin-film storage transistors), including those organized as NOR-type memory strings ("NOR memory strings"), and fabrication processes thereof.

BACKGROUND OF THE INVENTION

A NOR-type memory string includes storage transistors that share a common source region and a common drain region, where each storage transistor can be individually addressed and accessed. U.S. Pat. No. 10,121,553 (the '553 patent), entitled "Capacitive-Coupled Non-Volatile Thin- film Transistor NOR Strings in Three-Dimensional Arrays," issued on Nov. 6, 2018, discloses storage transistors (or memory transistors) organized as 3-dimensional arrays of NOR memory strings formed above a planar surface of a semiconductor substrate. The '553 patent is hereby incor- porated by reference in its entirety for all purposes. In the '553 patent, a NOR memory string includes numerous thin-film storage transistors that share a common bit line and a common source line. In particular, the '553 patent dis- closes a NOR memory string that includes (i) a common source region and a common drain region both running lengthwise along a horizontal direction and (ii) gate elec- trodes for the storage transistors each running along a vertical direction. In the present description, the term "ver- tical" refers to the direction normal to the surface of a semiconductor substrate, and the term "horizontal" refers to any direction that is parallel to the surface of that semicon- ductor substrate. In a 3-dimensional array, the NOR memory strings are provided on multiple planes (e.g., 8 or 16 planes) above the semiconductor substrate, with the NOR memory strings on each plane arranged in rows. For a charge-trap type storage transistor, data is stored in each storage tran- sistor using a charge storage film as the gate dielectric material. For examples, the charge storage film includes a tunneling dielectric layer, a charge trapping layer and a blocking layer, which can be implemented as a multilayer including silicon oxide or oxynitride, silicon-rich nitride, and silicon oxide, arranged in this order and referred to as an ONO layer. An applied electrical field across the charge storage film adds or removes charge from charge traps in the charge trapping layer, altering the threshold voltage of the storage transistor to encode a given logical state to the storage transistor.

Advances in electrically polarizable materials ("ferroelec- tric materials"), especially those that are being used in semiconductor manufacturing processes, suggest new potential applications in ferroelectric memory circuits. For example, the article "Ferroelectricity in Hafnium Oxide: CMOS compatible Ferroelectric Field Effect Transistors," by T. S. Böscke et al., published in 2011 *International Electron Devices Meeting (IEDM)*, pp. 24.5.1-24.5.4, dis- closes a ferroelectric field effect transistor ("FeFET") that uses hafnium oxide as a gate dielectric material. By con- trolling the polarization direction in a ferroelectric gate dielectric layer, the FeFET may be programmed to have either one of two threshold voltages. Each threshold voltage of the FeFET constitutes a state, for example, a "pro- grammed" state or an "erased" state, that represents a designated logical value. Such an FeFET has application in high-density memory circuits. For example, U.S. Pat. No. 9,281,044, entitled "Apparatuses having a ferroelectric field-effect transistor memory array and related method," by D. V. Nirmal Ramaswamy et al., filed on May 17, 2013, discloses a 3-dimensional array of FeFETs.

SUMMARY OF THE INVENTION

The present disclosure discloses a memory structure including three-dimensional NOR memory strings and method of fabrication, substantially as shown in and/or described below, for example in connection with at least one of the figures, as set forth more completely in the claims.

In some embodiments, a three-dimensional memory structure formed above a planar surface of a semiconductor substrate includes an array of thin-film storage transistors being organized as an array of stacks of NOR memory strings. The storage transistors within each NOR memory string share a common source layer and a common drain layer, spaced apart by a first isolation layer, with each layer extending along a first direction. The common source layer and the common drain layer each includes a semiconductor layer of a first conductivity type and a conductive layer, the conductive layer being formed between the first isolation layer and the respective semiconductor layer. Each NOR memory string extends along the first direction that is substantially parallel to the planar surface of the semicon- ductor substrate. The NOR memory strings of each stack are (a) provided one on top of another along a second direction substantially normal to the planar surface, and (b) isolated one from the other memory string by a second isolation layer. An additional semiconductor layer of a second con- ductivity is provided adjacent each stack of NOR memory strings and, with respect to each NOR memory string within the stack, in contact with the common source layer and the common drain layer of the NOR memory string, thus providing channel regions for the storage transistors of the NOR memory string. A gate dielectric layer is provided adjacent the additional semiconductor layer. A set of con- ductors are provided between adjacent stacks of NOR memory strings, each conductor extending along the second direction, and each serving as a common gate electrode for a group of storage transistors in the NOR memory strings of the adjacent stacks.

In other embodiments, a process suitable for use in fabricating a memory structure of storage transistors of a NOR memory string above a planar surface of a semicon- ductor substrate includes: above the planar surface, repeat- edly depositing, alternately and one over another, a multi- layer and an inter-layer sacrificial layer, each multilayer including first and second semiconductor layers, each of a first conductivity type, first and second sacrificial layers, and a first isolation layer between the first and second sacrificial layers, the first sacrificial layer being provided between the first semiconductor layer and the first isolation layer and the second sacrificial layer being provided between the second semiconductor layer and the first isolation layer; forming a first set of trenches in the multilayers and the inter-layer sacrificial layers, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; forming a third semiconductor layer of a second conductivity type on the sidewalls of the first set of trenches; forming a second set of trenches in the multilayers and the inter-layer sacrificial layers, each trench in the second set of trenches having substantially the same depth, length and width as the first set of trenches, and wherein the first and second set of trenches divide the multilayers into an array of stacks of multilayer strips, each stack being separated from an adjacent stack by one of the trenches; replacing the first and second sacrificial layers with first and second conductive layers; and forming the third semiconductor layer of the second conductivity type also on the sidewalls of the second set of trenches.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 3 illustrates a memory structure formed using dummy layers for isolating the channel layer for global word line connections in some embodiments.

DETAILED DESCRIPTION OF THE INVENTION

Figures 1, 1A:
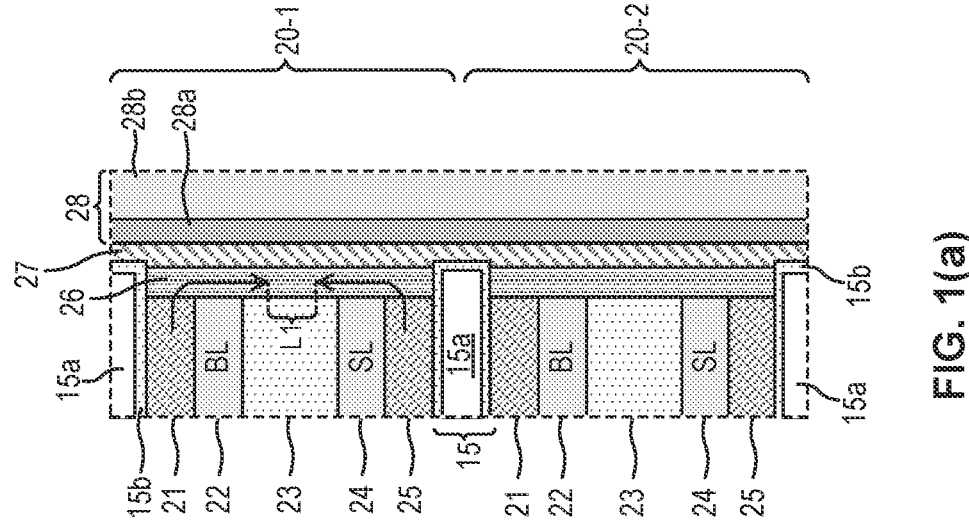
FIG. 1, which includes
FIG. 1(a), is a perspective view of a memory structure including a 3-dimensional array of NOR memory strings in some embodiments.

In embodiments of the present invention, a memory structure includes randomly accessible storage transistors organized as horizontal NOR memory strings, The NOR memory strings are formed over a semiconductor substrate in multiple scalable memory stacks of thin-film storage transistors. The storage transistors in each NOR memory string share a common source line and a common drain line extending in a horizontal direction. The channel layer of the storage transistors is formed on the sidewalls of the memory stacks, in contact with the common source line and the common drain line of each NOR memory string. Gate dielectric layers and gate conductor layers of the storage transistors are formed in a vertical direction in narrow trenches between the memory stacks to form storage transistors in multiple parallel planes of each stack, a storage transistor being formed at each intersection of a gate conductor layer and the common source line and the common drain line of a memory string. In the present description, the term "vertical" refers to the direction normal to the surface of a semiconductor substrate, and the term "horizontal" refers to any direction that is parallel to the surface of that semiconductor substrate.

In embodiments of the present invention, each memory stack includes multiple NOR memory strings formed one on top of another in the vertical direction. In some embodiments, the stacks of NOR memory strings are formed by groups of thin films successively deposited over a planar surface of a semiconductor substrate, each group of thin films being referred to as an "active layer" in the present description. The active layers in each stack of NOR memory strings are provided one on top of another and separated from the other by an inter-layer isolation layer. Each active layer includes the common drain line and the common source line, each line being arranged spaced apart from the other in the vertical direction by a channel spacer dielectric layer. Furthermore, the common drain line and the common line layer in each memory string are formed by respective first and second semiconductor layers, each contacted by respective first and second conductive layers.

In some embodiments, each NOR memory string is formed by an active layer where the first and second conductive layers are formed adjacent the channel spacer dielectric layer and between the channel spacer dielectric layer and the respective first or second semiconductor layer. That is, each active layer includes the first semiconductor layer, the first conductive layer, the channel spacer dielectric layer, the second conductive layer and the second semiconductor layer arranged in this order in the vertical direction. As thus configured, the first and second semiconductor layers forming the drain and source regions of each storage transistor are separated by first and second conductive layers as well as the channel spacer dielectric layer and thus the distance between the first and second semiconductor layers is extended. Such active layer configuration is particularly advantageous when the first and second semiconductor layers are doped with a dopant with high diffusivity, for example, when the semiconductor layers are polysilicon layers doped with phosphorus. The extended distance between the first and second semiconductor layers in the present configuration provides additional distance for the sideway diffusion of dopants into the channel area without shorting out the channel region. That is, a channel region is formed between the source and drain semiconductor layers even after the sideway diffusion of the source/drain dopants into the channel layer. By forming the drain and source conductive layers between the drain and source semiconductor layers, the storage transistors in the NOR memory strings can be reliably formed using readily available dopants for the drain and source semiconductor layers in the fabrication process.

In other embodiments, the memory structure is formed in a fabrication process where the channel layer is deposited as a continuous conformal layer on the sidewalls of the stacks and subsequently separated and isolated to each memory string in the stack by backside selective etching through access openings provided by an inter-layer sacrificial layer formed between each active layer and to be replaced in subsequent process steps by an inter-layer isolation layer. In one example, the stacks are formed by groups of thin films (active layers) separated by an inter-layer sacrificial layer, such as a silicon germanium or carbon layer, which is to be subsequently replaced by an insulation layer, which can be a dielectric layer or an air gap isolation. During intermediate processing steps, the inter-layer sacrificial layer is removed which provides access openings to the channel layer formed on the sidewall of the stacks at the areas between adjacent active layers. The exposed portion of the channel layer (referred herein as the backside of the channel layer) at each stack is etched using the access openings to separate and isolate the channel layer to each active layer, thereby forming the channel regions for the NOR memory strings in multiple planes.

In embodiments of the present invention, the memory structure can be constructed using air gaps as the insulation between the active layers forming the NOR memory strings in the vertical direction. Air gaps have a dielectric constant approximately 1.0, which is considerably lower than most dielectric materials, thereby effectively reducing the parasitic capacitance between adjacent pair of NOR memory strings in the vertical direction. Using air gaps as the isolation between active layers improve the isolation between adjacent NOR memory string and enhance the performance of the memory device formed therefrom. In some embodiment, the inter-layer isolation layer between active layers includes an air gap liner layer to passivate the exposed surfaces of the inter-layer cavities, the remaining unfilled portions of the cavities forming the air gap isolation.

In embodiments of the present invention, each storage transistor in the stacks of NOR memory strings may be isolated from other storage transistors in both the horizontal and vertical directions. In particular, each NOR memory string in a stack is isolated from other NOR memory strings in the same stack by the inter-layer isolation layer, which can be an air gap isolation. The storage transistors in each NOR memory string are further separated and isolated from each other along the NOR memory string (in the horizontal direction). For example, the channel layer between adjacent columns of the gate conductor layer formed in the narrow trenches is removed to isolate the storage transistors along the NOR memory strings in the horizontal direction. In this manner, each storage transistor can be completely isolated from other storage transistors in the same NOR memory string or from storage transistors in NOR memory strings formed in other planes in the same stack. The storage transistors in each NOR memory string are controlled by individual gate conductors to allow each storage transistor to be individually addressed and accessed.

In some embodiments, the storage transistors in the NOR memory strings are charge-trap type storage transistors. For a charge-trap type storage transistors, data is stored in a charge storage film in each storage transistor. For examples, the charge storage film includes a tunneling dielectric layer, a charge trapping layer and a blocking layer, which can be implemented as a multilayer including silicon oxide, silicon nitride, and silicon oxide, arranged in this order and referred to as an ONO layer. An applied electrical field across the charge storage film adds or removes charge from charge traps in the charge trapping layer, altering the threshold voltage of the storage transistor to encode a given logical state to the storage transistor.

In other embodiments, the storage transistors in the NOR memory strings are ferroelectric field effect transistors including a ferroelectric thin film as the gate dielectric layer, also referred to as the ferroelectric polarization layer or ferroelectric gate dielectric layer or ferroelectric dielectric layer. In a ferroelectric field effect transistor (FeFET), the polarization direction in the ferroelectric gate dielectric layer is controlled by an electric field applied between the transistor drain terminal and the transistor gate electrode, where changes in the polarization direction alters the threshold voltage of the FeFET. In some embodiments, the electric field is applied to both the transistor drain and source terminals, relative to the transistor gate electrode. For example, the FeFET may be programmed to have either one of two threshold voltages, where each threshold voltage of the FeFET can be used to encode a given logical state. For example, the two threshold voltages of the FeFET can be used to encode a "programmed" state and an "erased" state, each representing a designated logical value. In some embodiments, more than two threshold voltages may be established to represent more than two memory states at each FeFET.

Ferroelectric storage transistors realize particular advantages when applied to form the three-dimensional NOR memory strings in the present invention. Ferroelectric storage transistors manufactured on vertical walls are very compact and can be manufactured in three-dimensional memory stacks at lower temperatures that are compatible with logic back-end-of-line (BEOL) processes. Ferroelectric storage transistors can operate at lower voltages than conventional charge-trapping storage transistors. These characteristics of the ferroelectric storage transistors enable easy integration of a memory array of three-dimensional horizontal NOR (HNOR) memory strings directly above digital and analog integrated circuits that are built at the surface of a semiconductor substrate. Until recently, ferroelectric transistors had limited endurance. Recent advances in ferroelectric memory research has demonstrated erase/write endurance in excess of $1 \times 10^{11}$ cycles as well as fast erase and fast program operations, which enable the use of ferroelectric storage transistors in embedded memory applications. For example, Tan et al. demonstrated ferroelectric memory transistors formed on a crystalline silicon channel with endurance exceeding $10^{10}$ cycles. (See, for example, Ava Jiang Tan et al., "Ferroelectric $HfO_2$ Memory Transistors with High-K Interfacial Layer and Write Endurance Exceeding $10^{10}$ Cycles," arXiv:2103.08806 [physics.app-ph], submitted Mar. 16, 2021, available at https://arxiv.org/abs/2103.08806.)

In some embodiments, the ferroelectric storage transistors, as described herein, provide high endurance, long data retention, and relatively low voltage operations for both erase and programming operations (e.g., under +/−5.0 volts). By combining the ferroelectric or polarization characteristics with the 3-dimensional organization (e.g., as the thin-film NOR memory strings described herein), the memory structure of ferroelectric storage transistors of the present invention achieves the additional benefits of high-density, low-cost memory arrays with the advantages of high-speed, randomly accessed memory circuits with low read latency.

In the present description, to facilitate reference to the figures, a Cartesian coordinate reference frame is used, in which the Z-direction is normal to the planar surface of the semiconductor surface and the X-direction and the Y-directions are orthogonal to the Z-direction and to each other, as indicated in the figures. Furthermore, the drawings provided herein are idealized representations to illustrate embodiments of the present disclosure and are not meant to be actual views of any particular component, structure, or device. The drawings are not to scale, and the sizes and relative sizes and dimensions of layers and regions may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components throughout.

In the present description, the term "storage transistor" is used interchangeably with "memory transistor" to refer to the memory device formed in the memory structure described herein. In some examples, the memory structure of the present disclosure including NOR memory strings of randomly accessible storage transistors (or memory transistors) can have applications in computing systems as the main memory where the memory locations are directly accessible by the processors of the computer systems, for instance, in a role served in the prior art by conventional random-access memories (RAMs), such as dynamic RAMs (DRAMS) and static RAMs (SRAMs). For example, the memory structure of the present disclosure can be applied in computing systems to function as a random-access memory to support the operations of microprocessors, graphical processors and artificial intelligence processors. In other examples, the memory structure of the present disclosure is also applicable to form a storage system, such as a solid-state drive or replacing a hard drive, for providing long term data storage in computing systems.

FIG. 1, which includes FIG. 1(a), is a perspective view of a memory structure including a 3-dimensional array of NOR memory strings in some embodiments. The memory structure can be used to implemented part of a semiconductor memory device in some examples. Referring to FIG. 1, a memory structure 10 includes a number of active layers 16 formed on a planar surface of a semiconductor substrate 12. An insulating layer 14 may be provided between the semiconductor substrate 12 and the active layers 16 formed on the substrate. The active layers 16 are formed one on top of another in the Z-direction (i.e., along a direction normal to the planar surface of the substrate 12) and separated from each other by an inter-layer isolation layer 15. The active layers 16 are divided in the X-direction into narrow strips ("active strips") that are stacked one on top of another to form active stacks of active strips 17 ("active stacks 17") extending in the Y-direction. The stacks 17 are also referred to as memory stacks in the present description.

Each active layer 16 includes first and second doped semiconductor layers (e.g., $n^+$ polysilicon or heavily doped n-type polysilicon), each with an associated conductive layer (e.g., titanium nitride (TiN)-lined tungsten (W)), separated by a channel spacer dielectric layer (e.g., silicon oxide). Each conductive layer is formed adjacent one of the doped semiconductor layers to reduce the resistivity of the doped semiconductor layer it contacts. During intermediate processing steps, the active layer may include sacrificial layers (e.g., silicon nitride) to be subsequently replaced by conductive layers. Subsequent processing steps form the channel layers (e.g., $p^-$ polysilicon or lightly doped p-type polysilicon), the gate dielectric layers, and the gate conductor layers (e.g., TiN-lined W) in narrow trenches 18 between the separated active stacks. The narrow trenches 18 are also referred to as "LWL trenches" in the present description. The gate conductor layers and the gate dielectric layers are formed as columnar structures extending in the Z-direction. In the present description, the gate conductor layers are also referred to as "local word lines" and a gate conductor with a gate dielectric layer is collectively referred to a local word line (LWL) structure 43. The local word line structures 43 in each trench 18 are separated from each other by a dielectric-filled shaft 42.

The first and second doped semiconductor layers of each active strip form a drain region ("common bit line") and a source region ("common source line"), respectively, of the storage transistors. The storage transistors may be formed along one or both sides of the active strip in an active stack 17. In particular, a storage transistor 20 is formed at the intersection of an active strip with the channel layer and an LWL structure 43. In the present illustration, the LWL structures 43 are formed staggered in adjacent trenches bordering an active strip so that storage transistors formed on both sides of an active strip are offset from each other in the Y-direction along the memory string.

In some embodiments, the storage transistors are charge-trapping type storage transistors and the gate dielectric layer is a charge storage film. In some embodiments, the charge storage film includes a tunneling dielectric layer, a charge trapping layer and a blocking layer. In one example, the charge storage film can be implemented as a multilayer including silicon oxide, silicon nitride, and silicon oxide, arranged in this order and referred to as an oxide-nitride-oxide multilayer or an ONO layer. In other examples, the tunneling dielectric layer may be any silicon oxide ($SiO_x$), any silicon nitride ($Si_xN_y$), any silicon oxide nitride (SiON), any aluminum oxide ($AlO_x$), any hafnium oxide ($HfO_x$), zirconium oxide ($ZrO_x$), any hafnium silicon oxide ($HfSi_xO_y$), any hafnium zirconium oxide (HfZrO), or any combination thereof. In some further examples, the charge-trapping layer may be a single layer or a multilayer and may include any silicon nitride ($Si_xN_y$), hafnium oxide ($HfO_2$), or hafnium silicon oxynitride (HfSiON). Finally, in some examples, the blocking layer may be any silicon oxide ($SiO_x$), aluminum oxide ($Al_2O_3$), or both. As known to those of ordinary skill in the art, each of these materials need not be the stoichiometric compounds. For example, the silicon nitride in the charge-trapping layer may be silicon-rich nitride.

In other embodiments, the storage transistors are ferroelectric storage transistors and the gate dielectric layer is a ferroelectric gate dielectric layer. In some embodiments, the ferroelectric gate dielectric layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric gate dielectric layer is a material selected from: zirconium-doped hafnium oxide (HZO), silicon-doped hafnium oxide (HSO), aluminum zirconium-doped hafnium oxide (HfZrAlO), aluminum-doped hafnium oxide ($HfO_2$:Al), lanthanum-doped hafnium oxide ($HfO_2$:La), hafnium zirconium oxynitride (HfZrON), hafnium zirconium aluminum oxide (HfZrAlO), and any hafnium oxide that includes zirconium impurities.

A salient feature of the memory structure 10 is that in each active layer, the conductive layer of the common drain line or the common source line is formed between the channel spacer dielectric layer and the respective first or second semiconductor layer. More specifically, a first conductive layer is formed between the channel spacer dielectric layer and the first semiconductor layer; and a second conductive layer is formed between the channel spacer dielectric layer and the second semiconductor layer. As thus configured, in each active layer, the first and second semiconductor layers are spaced apart by the channel spacer dielectric layer as well as the first and second conductive layers. Although such a configuration increases the spacing between the first and second semiconductor layers in the storage transistors, the channel length of the storage transistors is not necessarily increased. Instead, this active layer arrangement provides for additional distance for the dopants of the first and second semiconductor layers to diffuse into the channel layer without shorting the drain region and the source region while providing a desirable channel length for the storage transistor. As thus configured, the memory structure 10 enables the use of dopant types for the drain/source semiconductor layers that are more readily available or more cost effective but may have a higher diffusivity. For example, the memory structure 10 can be fabricated using phosphorus as an n-type dopant for the first and second semiconductor layers. For a given thermal budget of the fabrication process, the first and second conductive layers provide the additional distance for the n-type dopant to diffuse in the p-doped channel layer without shorting the drain and source regions.

FIG. 1(a) illustrates the detail construction of storage transistors 20 formed in the memory structure 10. In particular, a pair of adjacent storage transistors, identified as storage transistors 20-1 and 20-2, are formed in adjacent planes are shown. Referring to FIG. 1(a), the storage transistor 20 is formed by the first doped semiconductor layer 21 forming the drain region (the common drain line), the second doped semiconductor layer 25 forming the source region (the common source line), the channel layer 26 in contact with both the drain region 21 and the source region 25, the gate conductor 28 and the portion of the gate dielectric layer 27 that is situated between the gate conductor 28 and the channel layer 26. The first conductive layer 22 contacts the first doped semiconductor layer 21 to form the common drain line (also referred to as the "common bit line") and is formed between the first doped semiconductor layer 21 and the channel spacer dielectric layer 23. The second conductive layer 24 contacts the second doped semiconductor layer 25 to form the common source line and is formed between the second doped semiconductor layer 25 and the channel spacer dielectric layer 23.

Each storage transistor 20 is isolated from adjacent storage transistors along an active stack (in the Z-direction) by the inter-layer isolation layer 15. In the present embodiment, the inter-layer isolation layer 15 is an air gap isolation formed by an air gap cavity 15a and an optional air gap liner 15b. The air gap liner 15b is a dielectric layer used to passivate the exposed surface of the air gap cavity 15a. In one embodiment, the air gap liner 15b is a silicon nitride layer. The air gap liner 15b may be 1 nm-3 nm thick. In FIG. 1(a), elements are sometimes exaggerated in size for illustrative purposes only. It is understood that the depictions in this and other figures are not necessarily to scale. The air gap cavities 15a forming the inter-layer isolation layer 15 provide effective isolation between adjacent storage transistors 20 along a memory stack. In embodiments of the present invention, the inter-layer isolation layer 15 is also used to provide physical separation between the channel layer 26 of one storage transistor and the channel layer of the storage transistors above or below it in the same memory stack, as will be described in more details below.

In the present example, the gate conductor layer 28 includes a titanium or titanium nitride layer 28a bordering the gate dielectric layer 27 and a conductive filler layer 28b, such as tungsten or a heavily doped polysilicon layer, filling the remaining area in the local word line. As thus configured, along each active strip (in the Y-direction), the storage transistors that share the common source line and the common bit line form a NOR memory string (referred herein as a "Horizontal NOR memory string" or "HNOR memory string").

With the storage transistor 20 thus formed, the first and second semiconductor layers 21, 25 have an n-type conductivity, and the channel layer 26 has a p-type conductivity. The first and second semiconductor layers 21, 25 are more heavily doped than the channel layer 26. During the fabrication process, thermal excursions in any of the fabrication steps may cause the n-type dopants from the first and second semiconductor layers 21, 25 to diffuse into the p-type channel layer 26, as indicated by the arrows in FIG. 1(a). The sideway or lateral diffusion (in the Z-direction) of the n-type dopants from each of the first and second semiconductor layers 21, 25 into the channel layer 26 converts part of the channel layer 26 to n-type conductivity, essentially forming a drain region and a source region in the channel layer but leaving a channel region between the source and drain regions. For example, the channel region may have a channel length of L1.

In embodiments of the present invention, the first and second semiconductor layers 21, 25 are separated by the first and second conductive layers 22, 24 and the channel spacer dielectric layer 23 to provide additional distance for the lateral diffusion of the n-type dopants. In this manner, the storage transistor 20 can be formed using a high diffusivity n-type dopant, such as phosphorus, while ensuring the storage transistor 20 can be formed without shorting of the source and drain region and with a channel region having the desirable channel length. In particular, in the storage transistor 20 of the present invention, the channel spacer dielectric layer 23 and the first and second conductive layers 22 and 24 do not define the channel length of the storage transistor thus formed. Instead, lateral diffusion of the source/drain dopants shortens and forms the channel region between the diffused areas. The channel region has a channel length of L1 which is shorter than the thickness of the channer spacer dielectric layer 23 and the thicknesses of the first and second conductive layers (thicknesses refer to dimensions in the Z-direction). In other words, the channel region has a channel length L1 shorter than the distance separating the first and second semiconductor layers 21, 25. In some embodiments, the doping level of the first and second semiconductor layers 21, 25 is selected to be high enough to provide a sufficient ohmic contact with the respective first and second conductive layers but low enough to limit the lateral diffusion into the channel layer.

Referring again to FIG. 1, to complete the memory circuit, various types of circuitry are formed in or at the surface of the semiconductor substrate 12 to support the operations of the HNOR memory strings. Such circuits are referred to as "circuits under array" ("CuA") and may include digital and analog circuitry such as decoders, drivers, sense amplifiers, sequencers, state machines, exclusive OR circuits, memory caches, multiplexers, voltage level shifters, voltage sources, latches and registers, and connectors, that execute repetitive local operations such as processing random address, activate, erase, program, read, and refresh commands with the memory arrays formed above the semiconductor substrate 12. In some embodiments, the transistors in the CuA is built using a process optimized for the control circuits, such as an advanced manufacturing process that is optimized for forming low-voltage and faster logic circuits. In some embodiments, the CuA is built using fin field-effect transistors (FinFET) or gate-all-around field-effect transistors (GAAFET) to realize a compact circuit layer and enhanced transistor performance.

In some embodiments, the CuA provides the data path to and from the memory array and further to a memory controller that may be built on the same semiconductor substrate as the CuA. Alternatively, the memory controller may reside on a separate semiconductor substrate, in which case the CuA and the associated data path are electrically connected to the memory controller using various bonding techniques. In some examples, the memory controller includes control circuits for accessing and operating the storage transistors in the memory array connected thereto, performing other memory control functions, such as data routing and error correction, and providing interface functions with systems interacting with the memory array.

The memory structure 10 of FIG. 1 illustrates a construction of a 3-dimensional array of NOR memory strings in some embodiments. In some embodiments, the memory structure 10 is fabricated in process that realizes advantageous features for the memory structure. First, the memory structure 10 is formed so that the storage transistors in the 3-dimensional array of NOR memory strings are individually isolated from other storage transistors. In particular each storage transistor is isolated in the vertical direction by the inter-layer isolation layer and in the horizontal direction by isolating the channel layer to each local word line structure 43, as shown in FIG. 1. The performance characteristics of the storage transistors are enhanced by individually isolating each storage transistors. Second, the channel layer can be deposited conformally and then channel separation between active layers in the memory stacks is realized by etching through access openings formed by the inter-layer sacrificial layer. This results in a simplified and more reliable process for forming the channel layer. Third, after the removal of the inter-layer sacrificial layer for channel separation, the remaining cavities between active layers can form air gap isolation between the active layers, realizing better isolation than most dielectric materials.

The memory structure 10 of the present disclosure includes a memory array portion fabricated as described above to form the 3-dimensional array of NOR memory strings. To complete the memory device, the memory structure includes staircase portions provided at the ends of the memory strings (in the Y-directions). The staircase portions are not shown in the present figures to simplify the discussion. The thin-film storage transistors of the NOR memory strings are formed in the memory array portion while the staircase portions include staircase structures to provide connections through conductive vias to the common bit lines and, optionally, the common source lines, of the NOR memory strings. In some embodiments, the common source lines are pre-charged to serve as virtual voltage reference source during program, erase and read operations, thereby obviating the need for a continuous electrical connection with the support circuitry during such operations. In the present description, the common source lines are described as being electrically floating. Various processing steps for forming staircase structures in the memory structure can be used. The processing steps for forming the staircase structures can be before, after, or interleaved with the processing steps for forming the memory array portion described below.

Figure 2A:
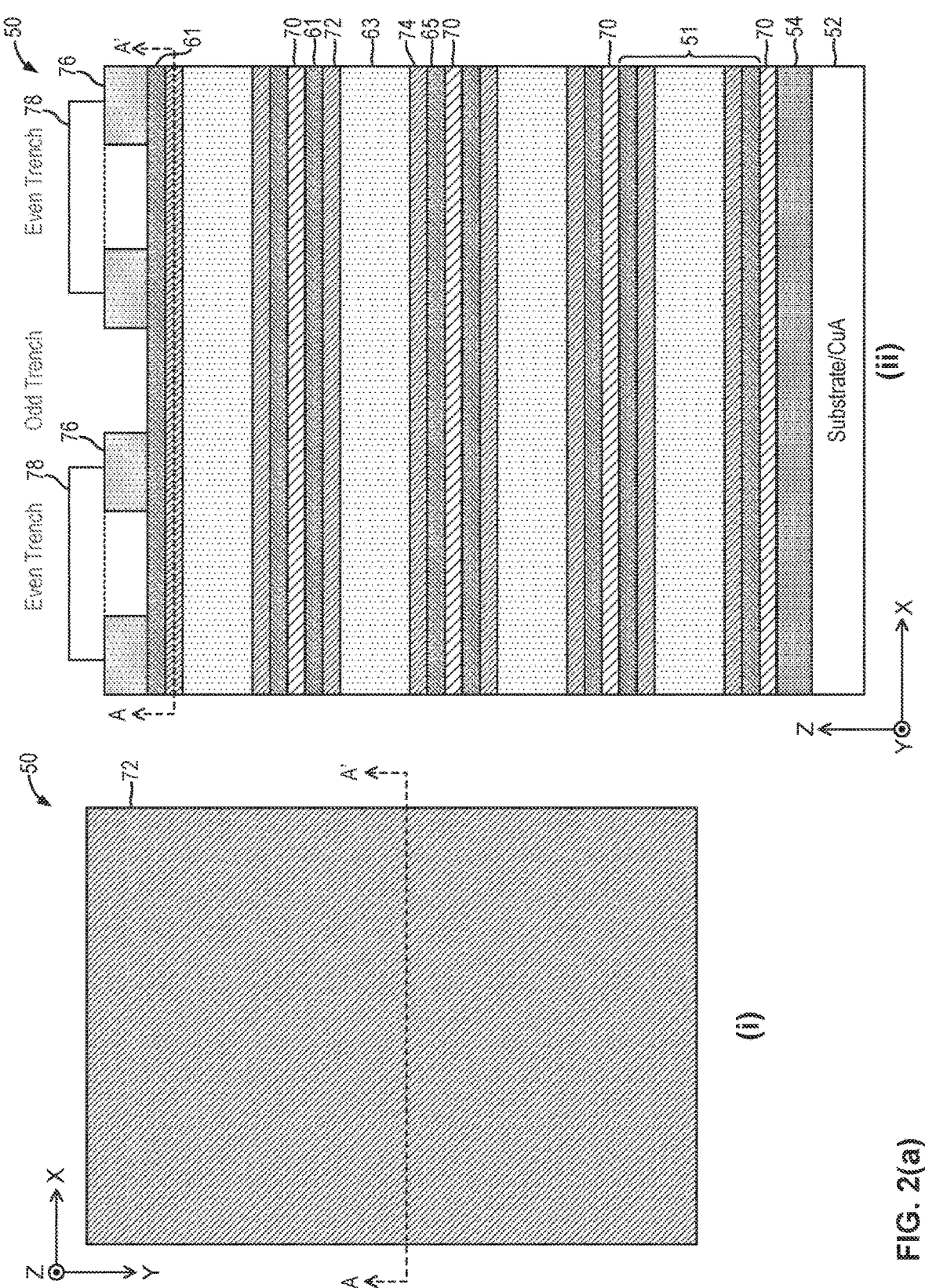
FIGS. 2(a) to 2(s), including FIGS. 2(l1) and 2(o1), illustrate a process for fabricating a memory structure including HNOR memory strings in embodiments of the present invention.
Figure 2B:
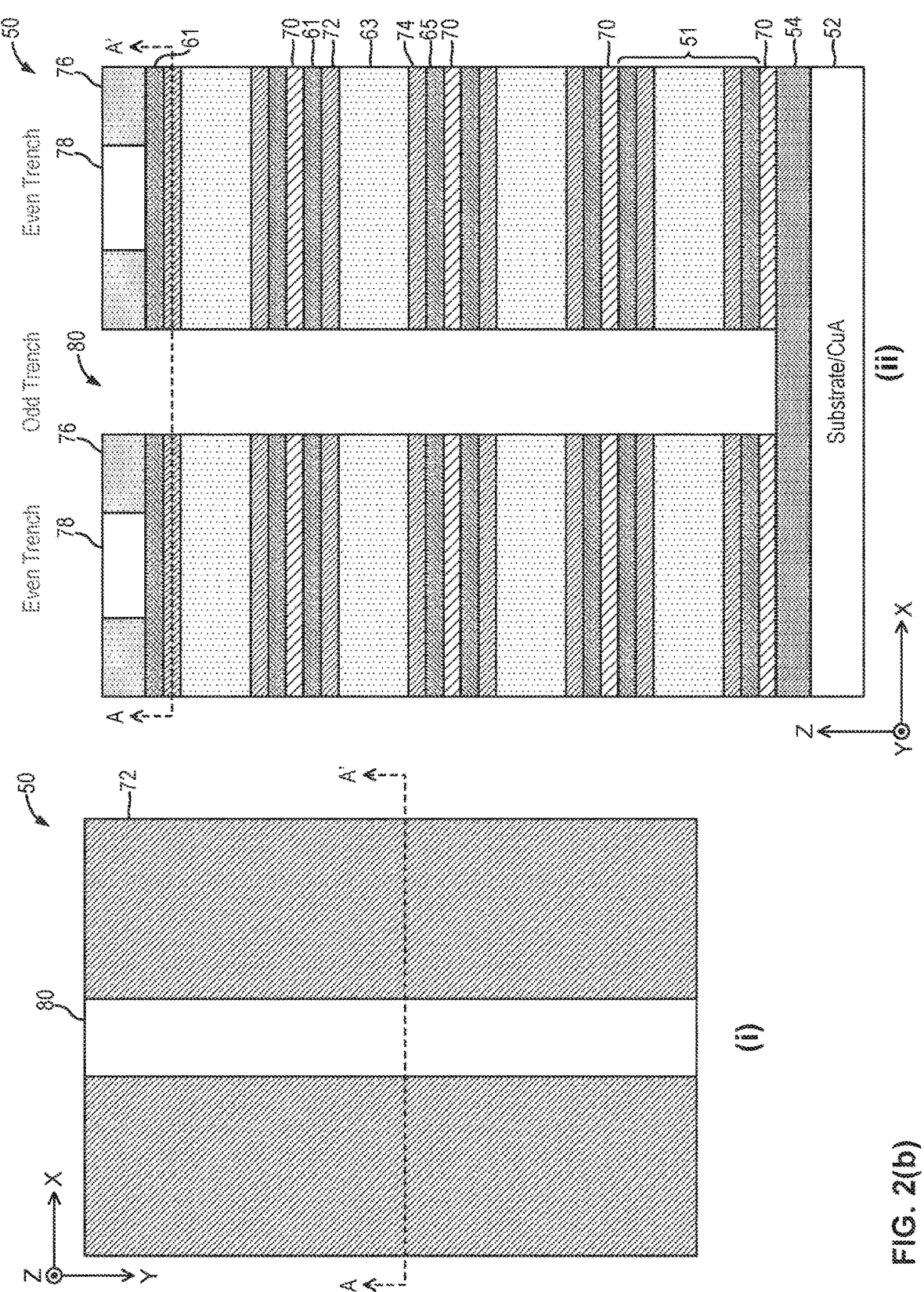
Figure 2C:
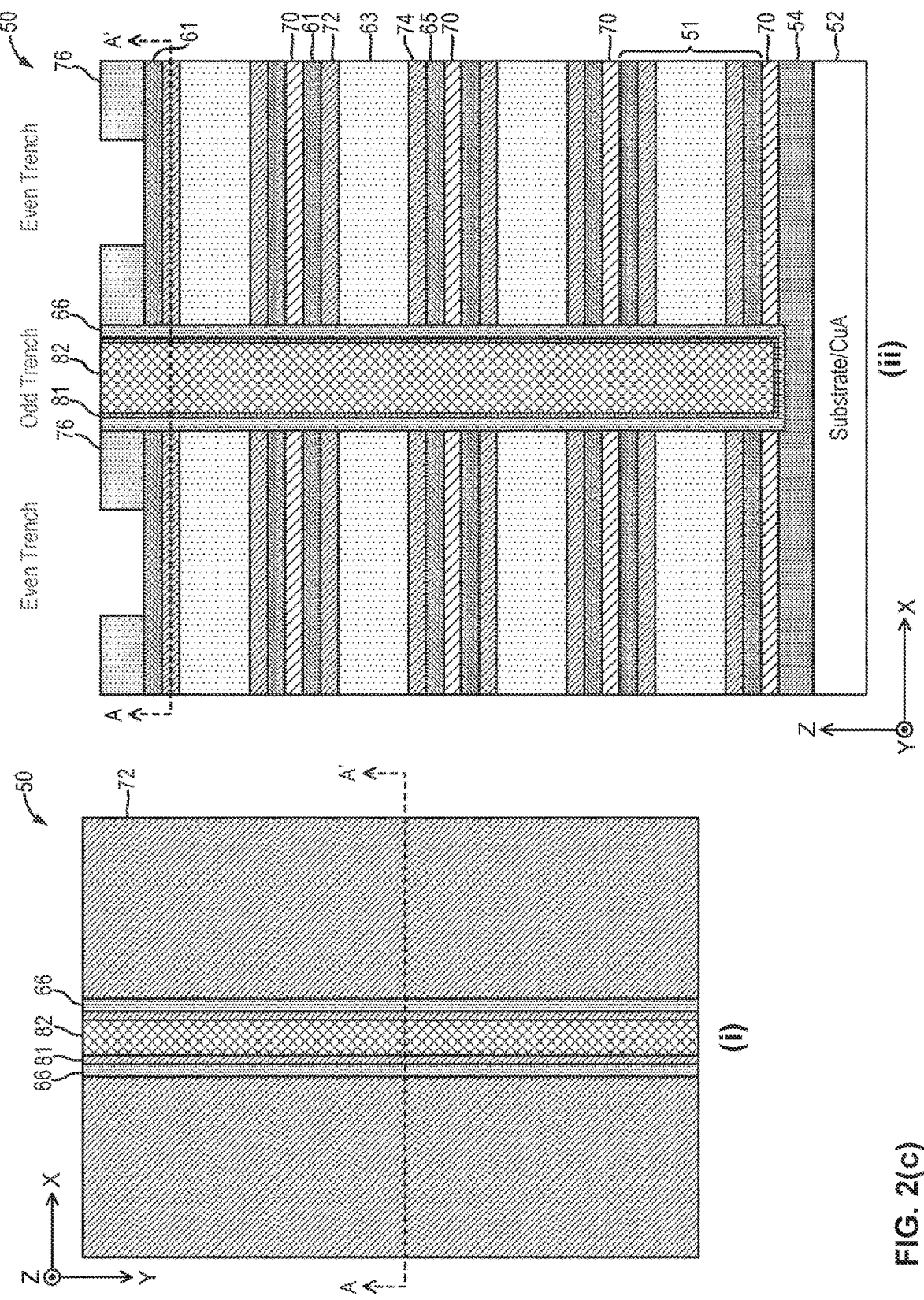
Figure 2D:
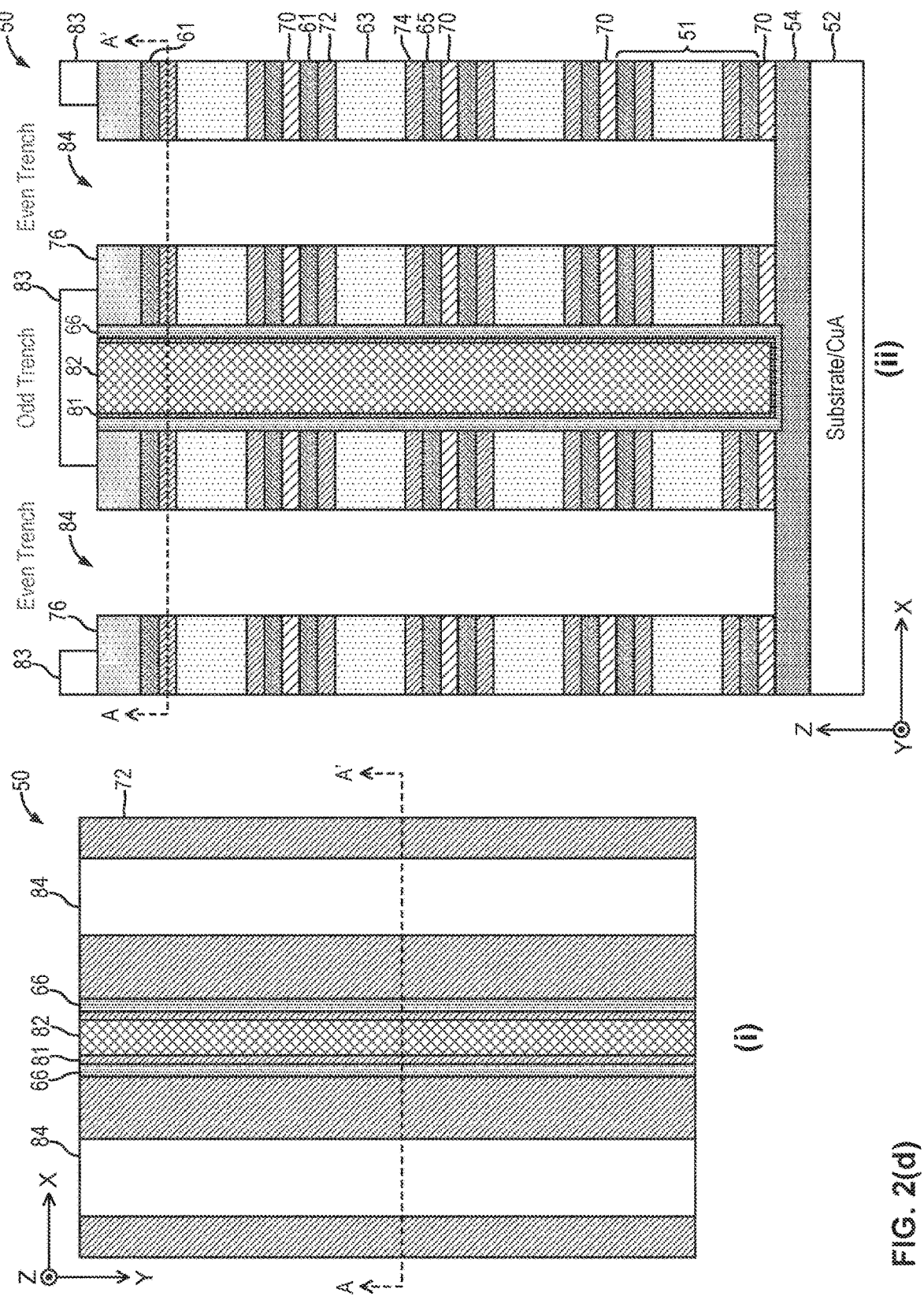
Figure 2E:
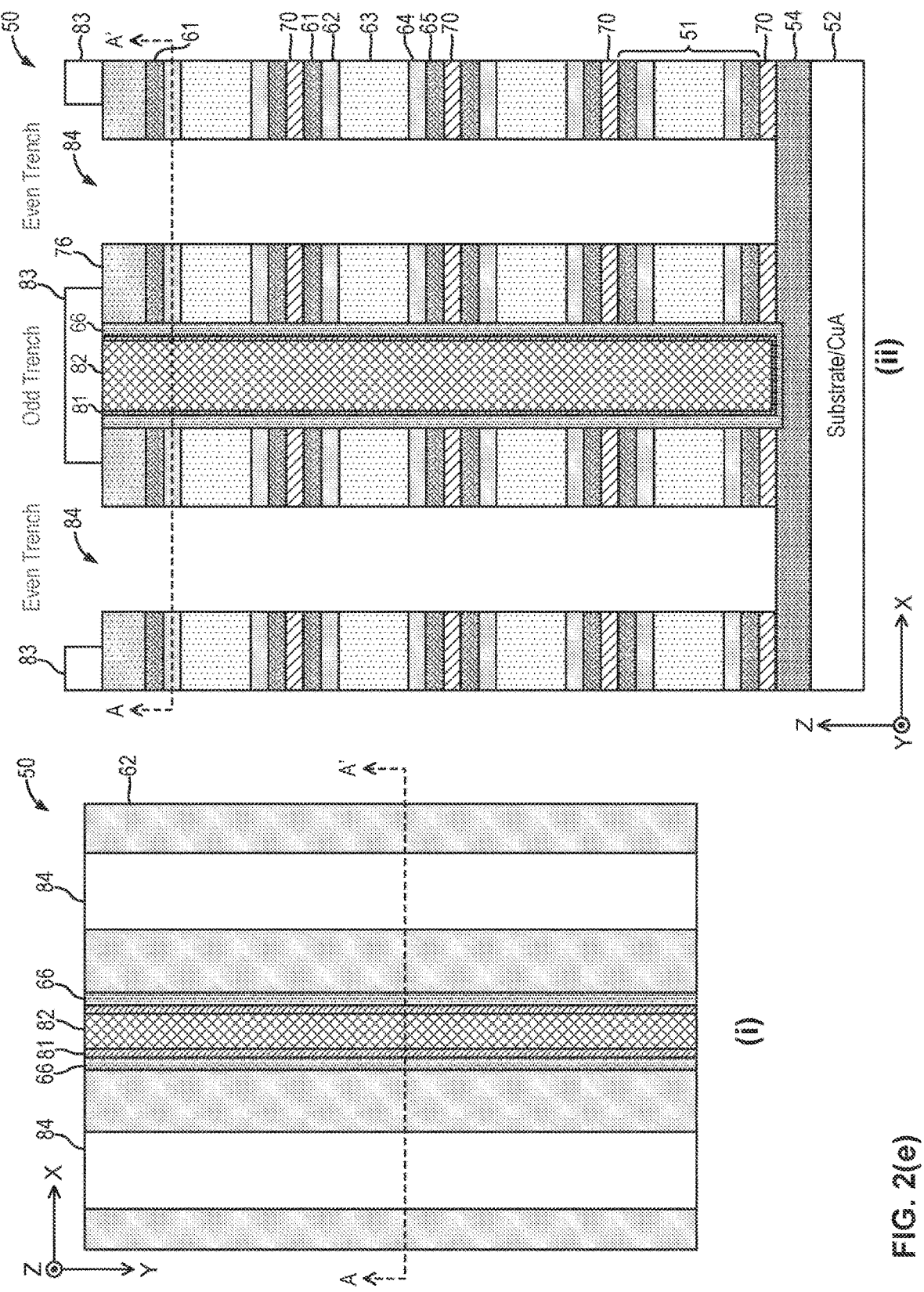
Figure 2F:
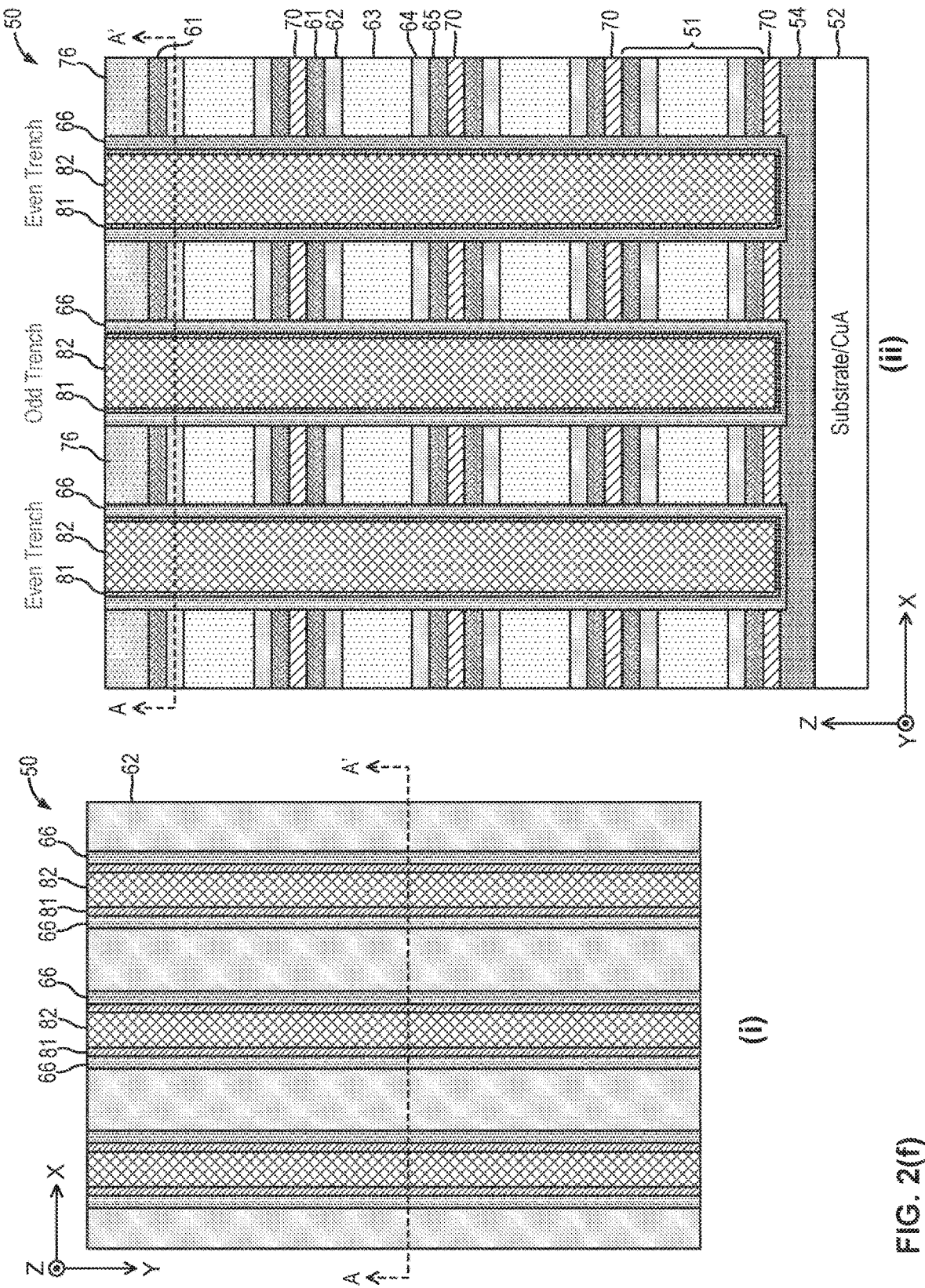
Figure 2G:
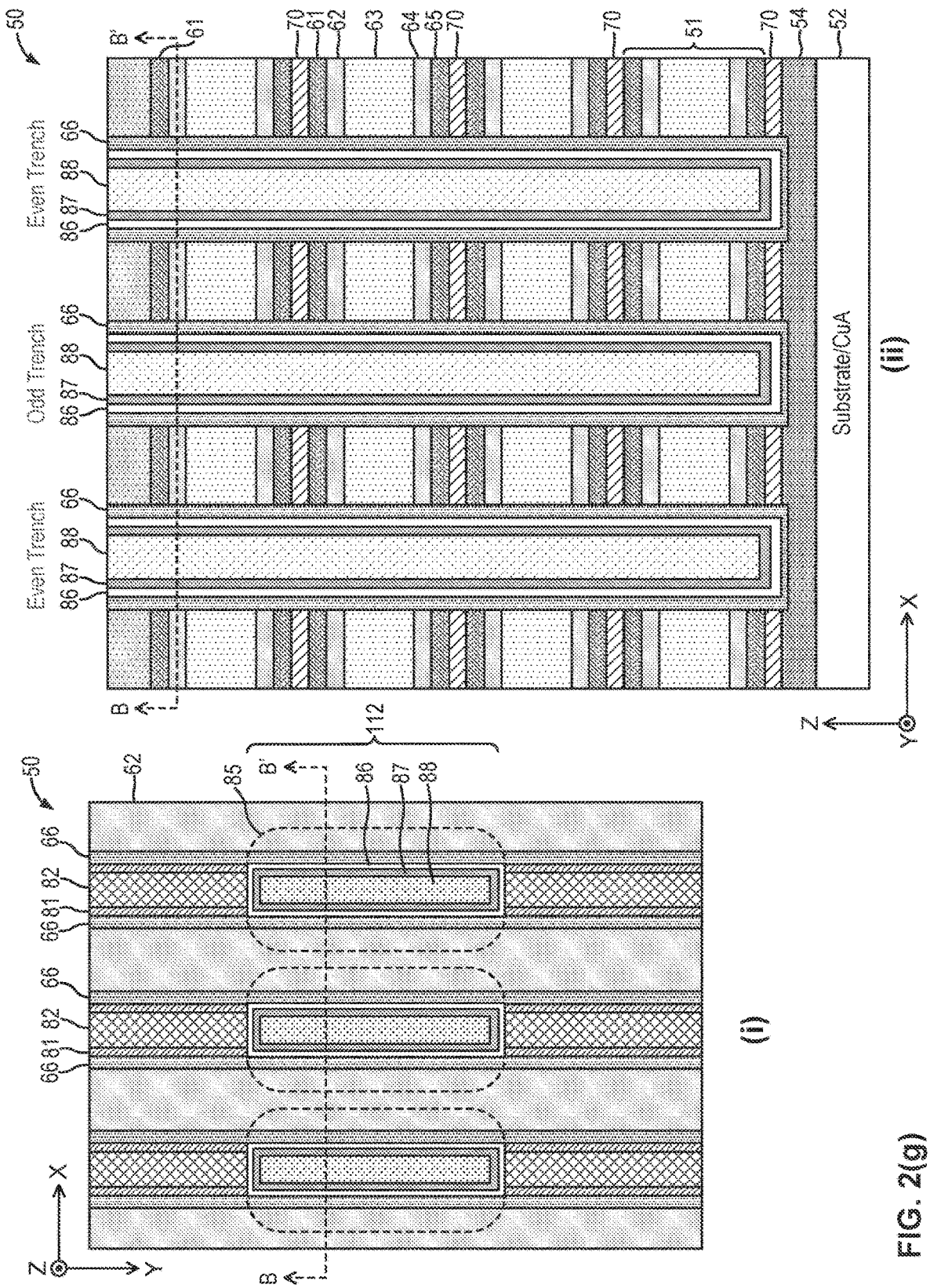
Figure 2H:
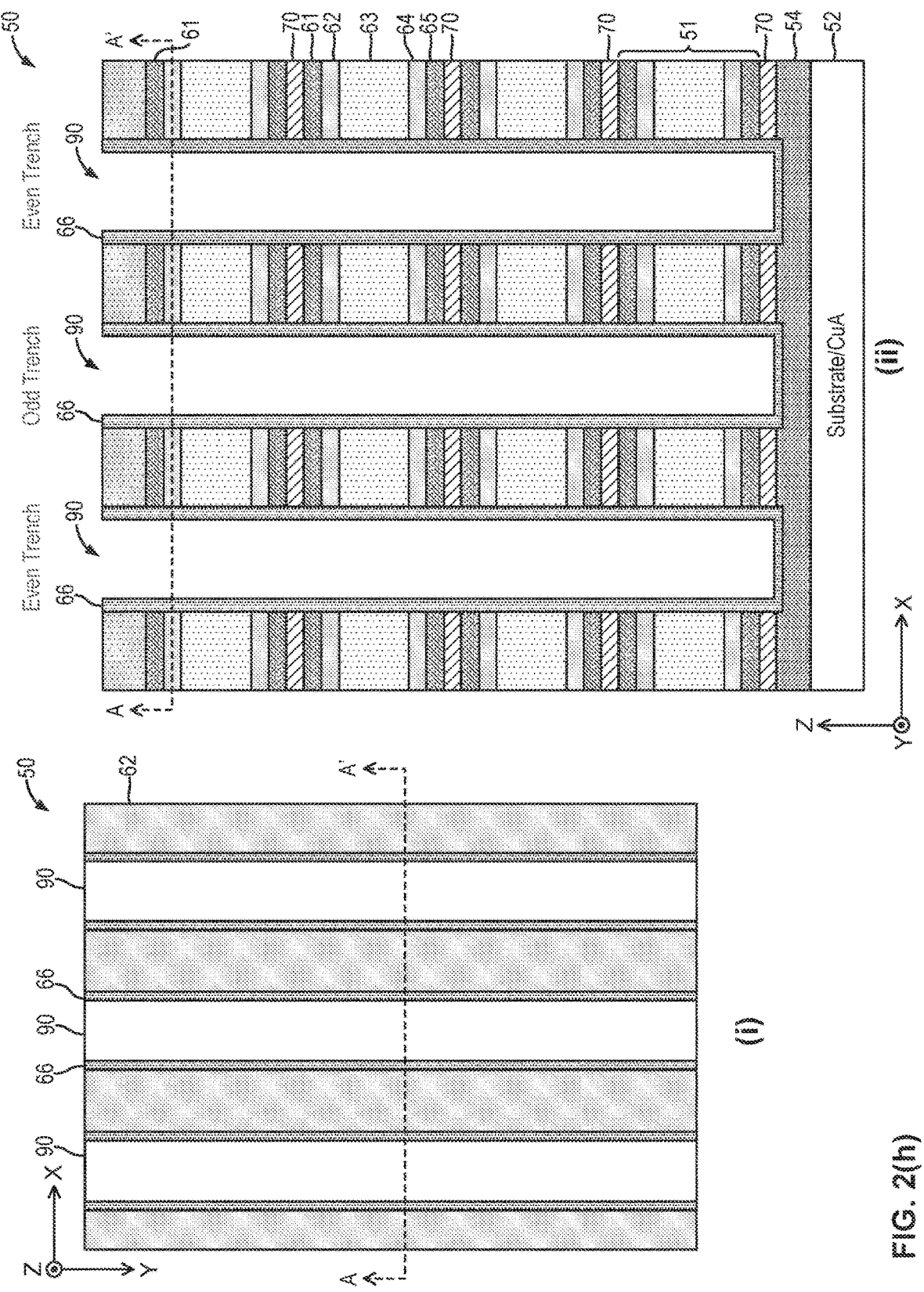
Figure 2I:
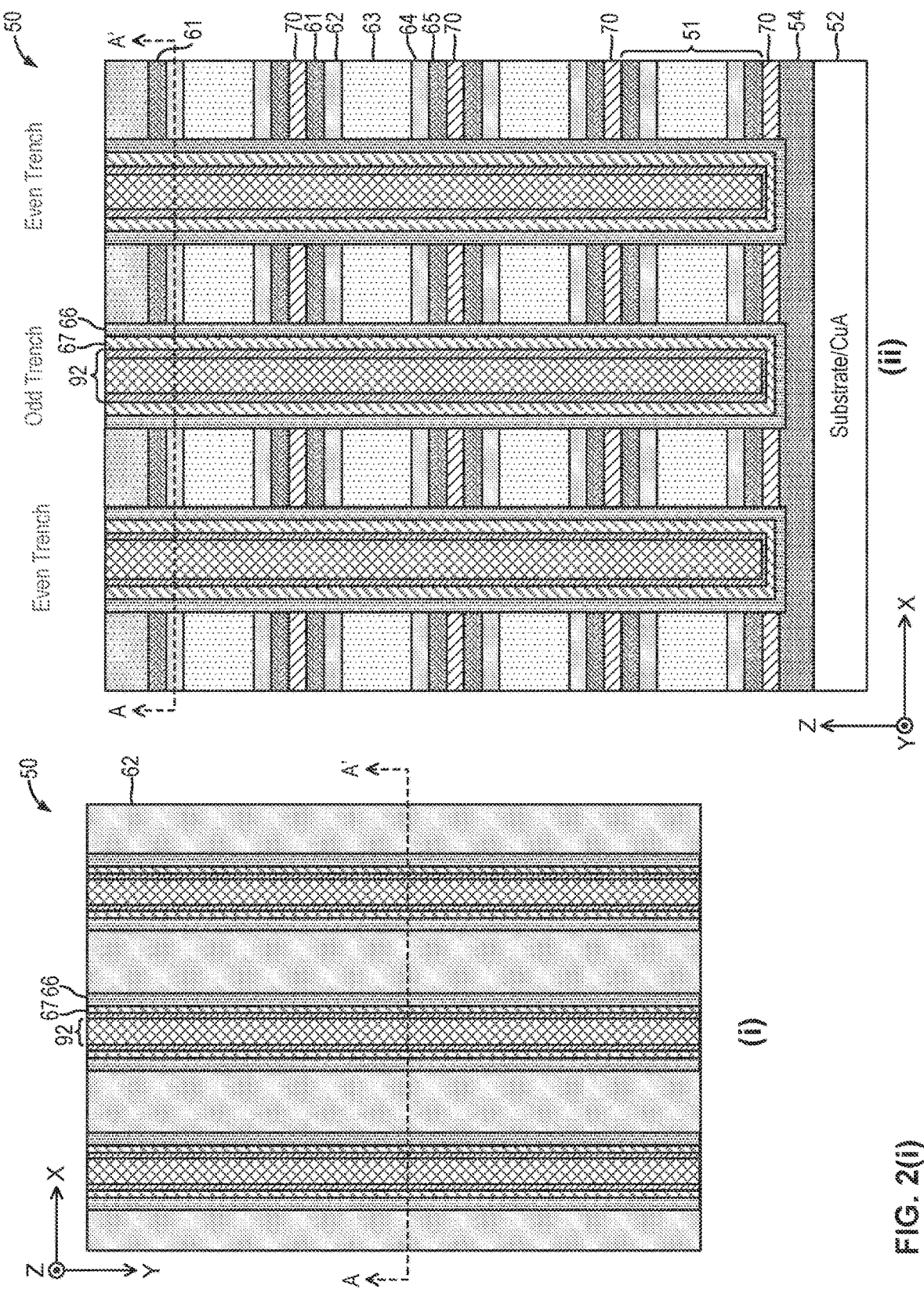
Figure 20:
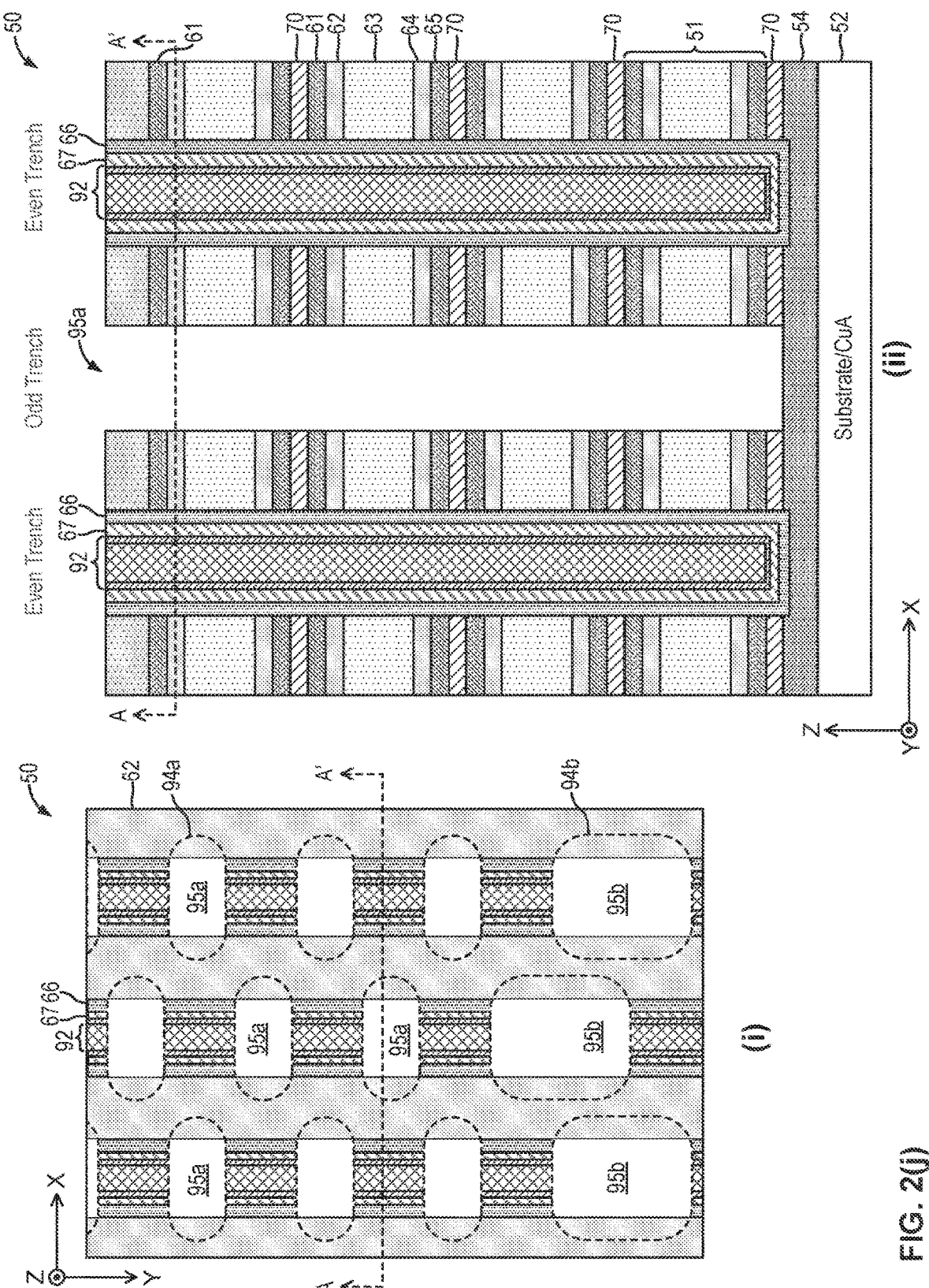
Figure 2K:
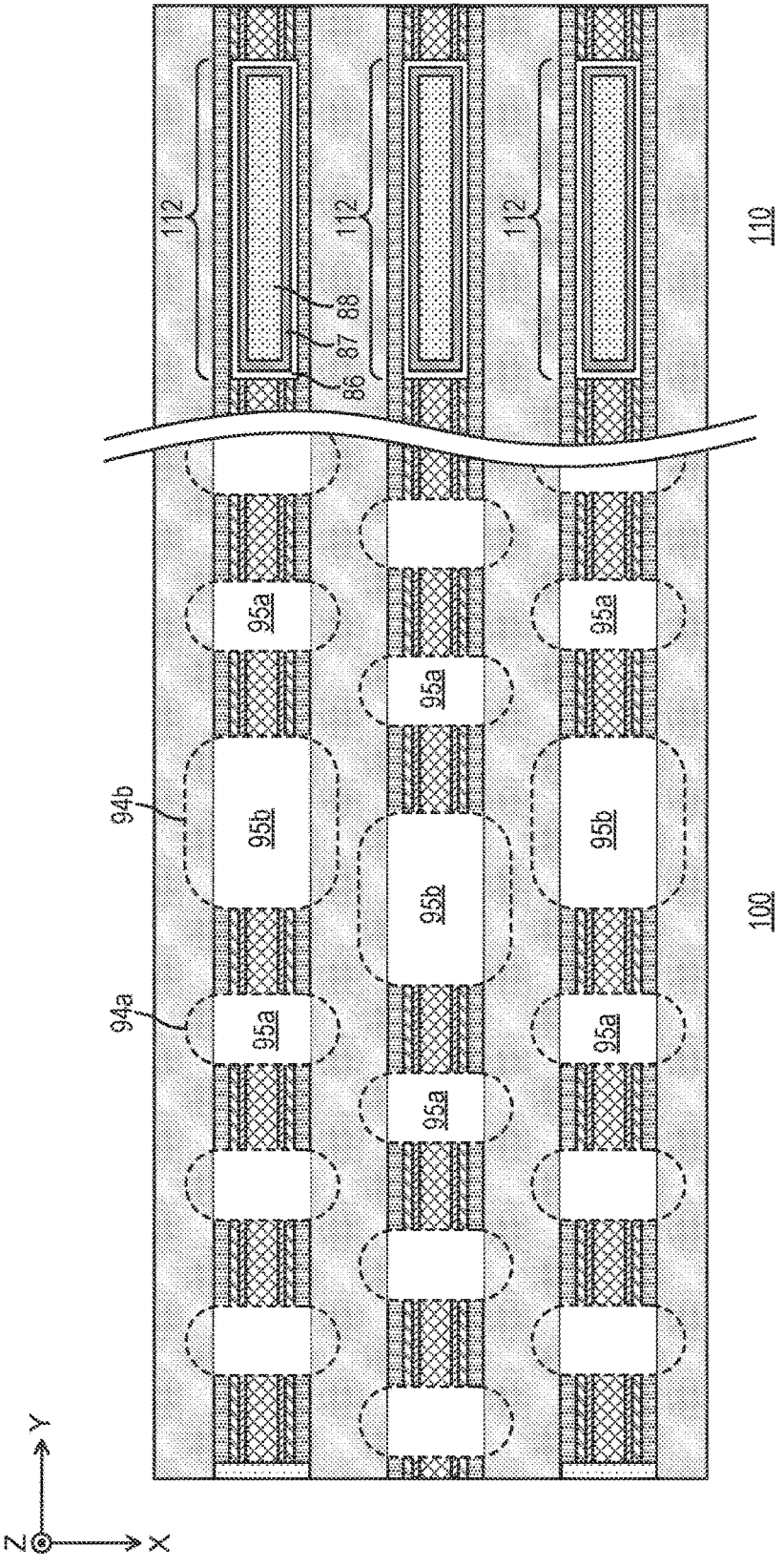
Figure 2I:
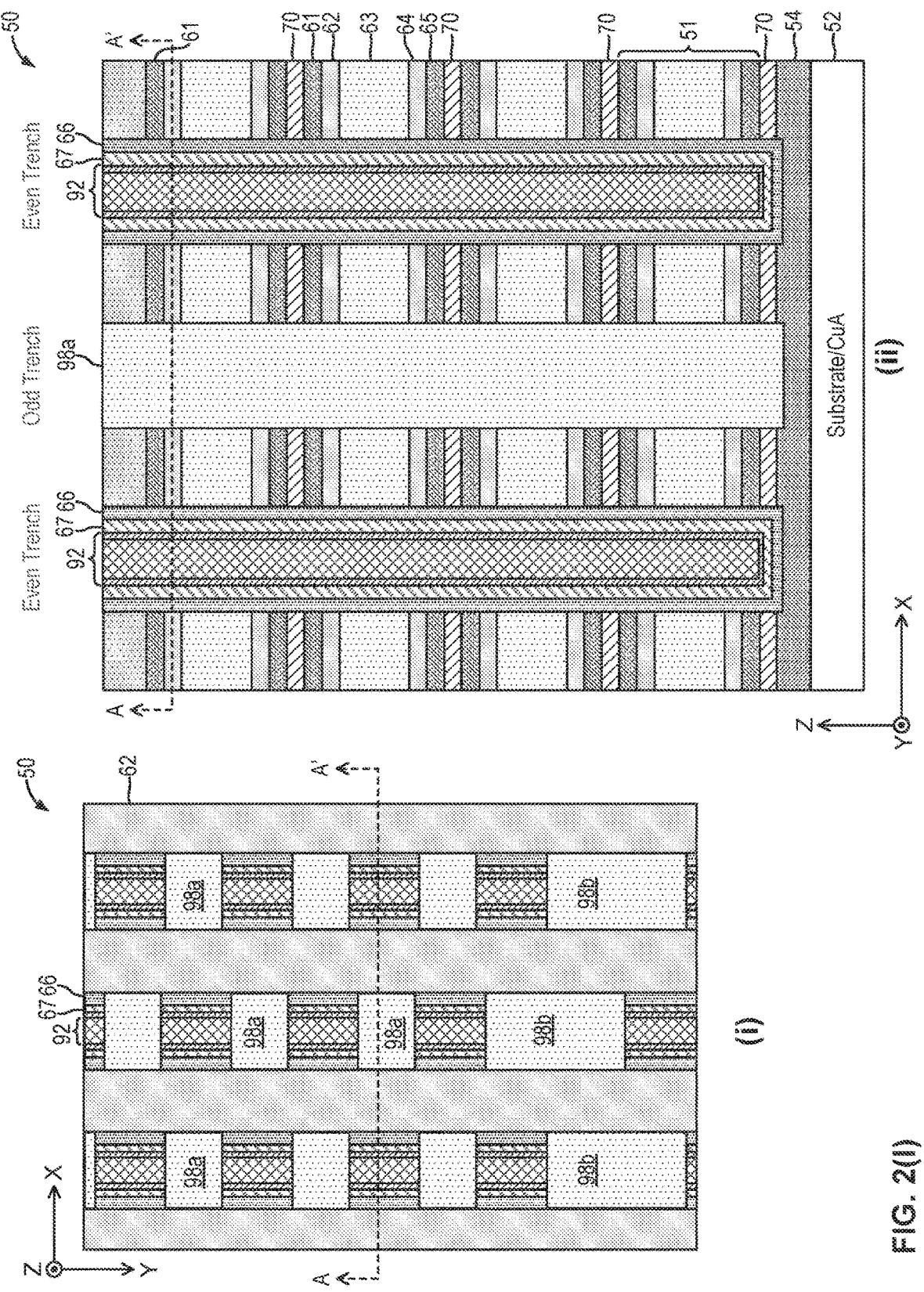
Figure 2:
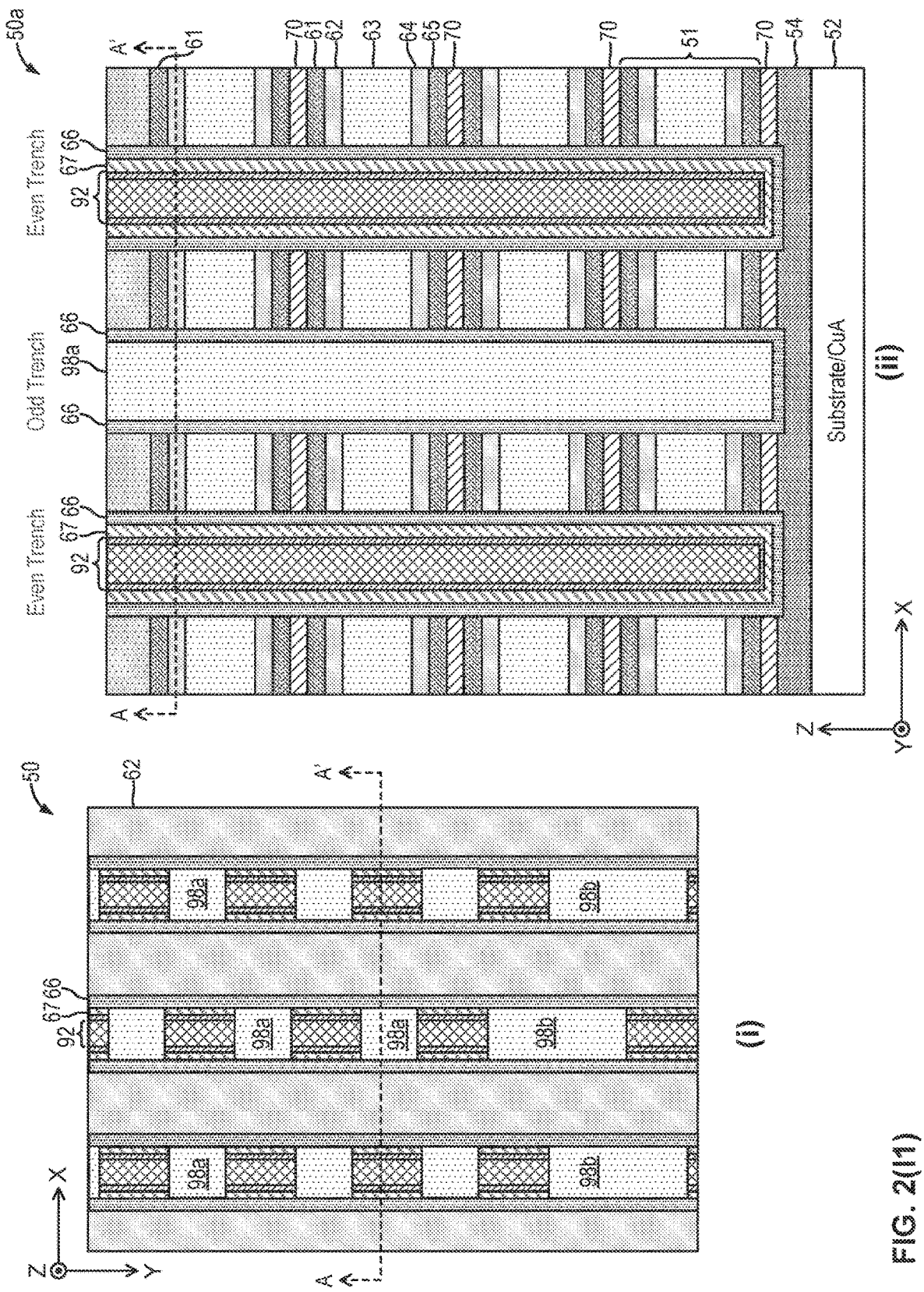
Figure 2M:
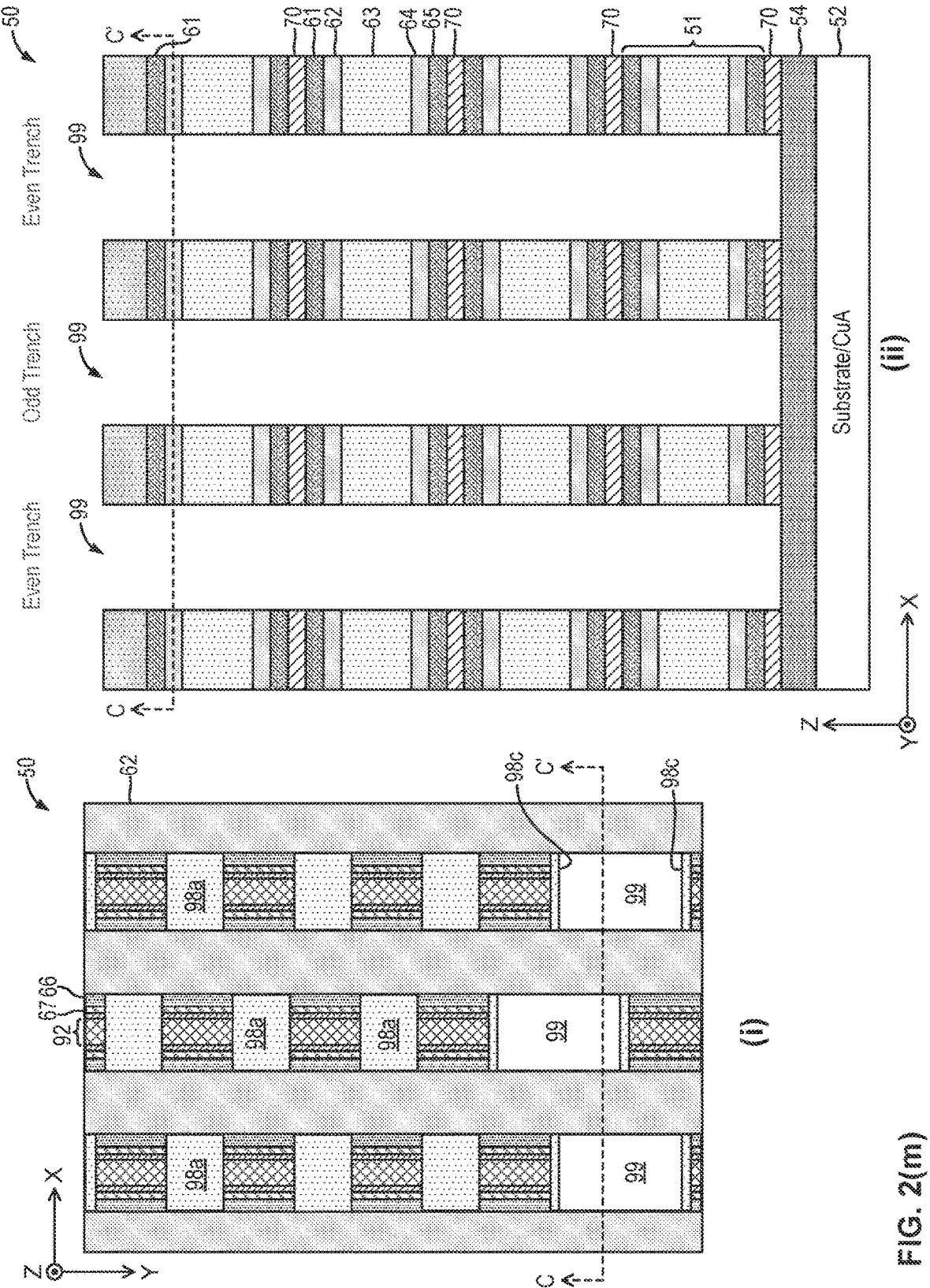
Figure 2N:
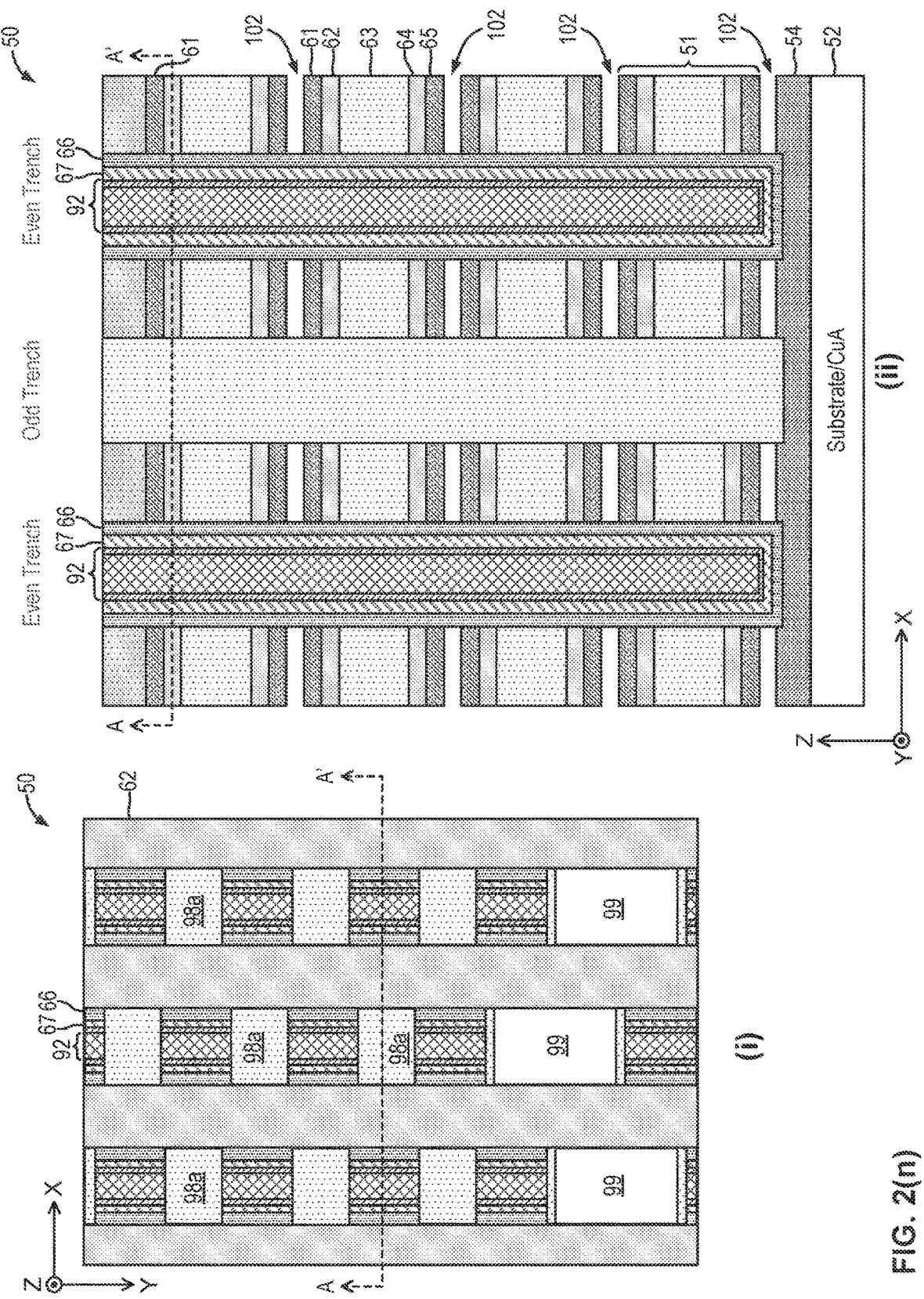
Figure 2O:
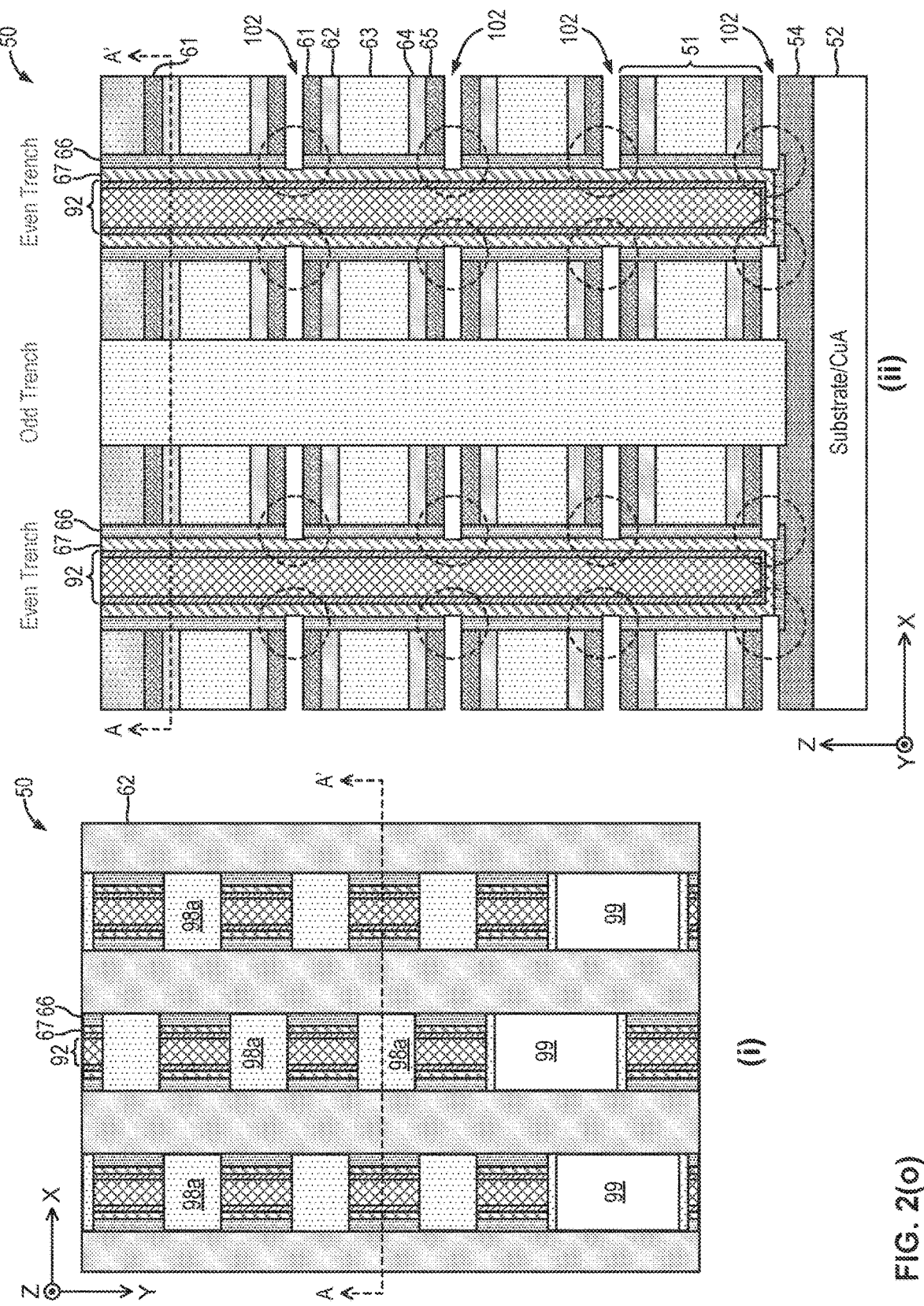
Figure 2:
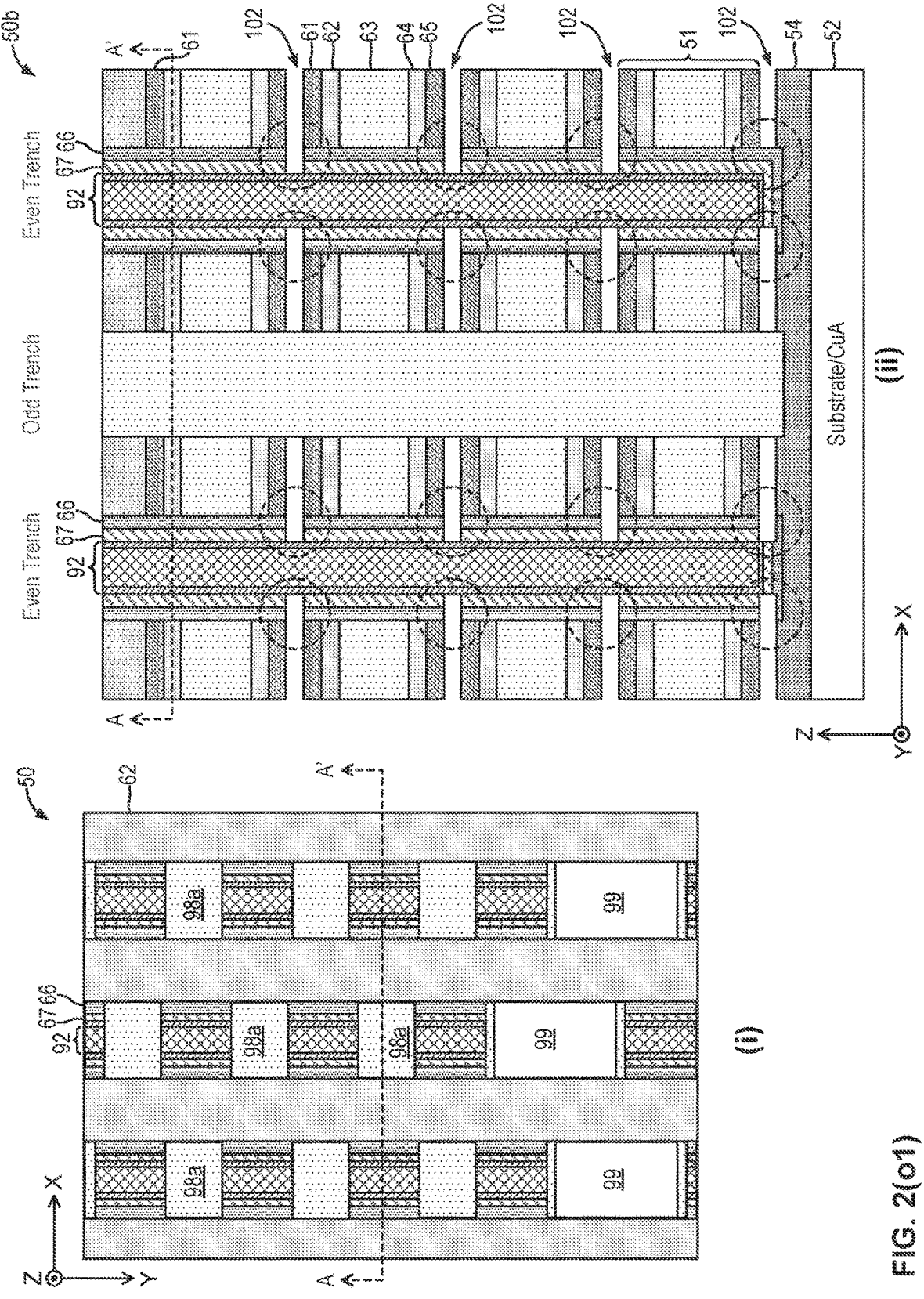
Figure 2P:
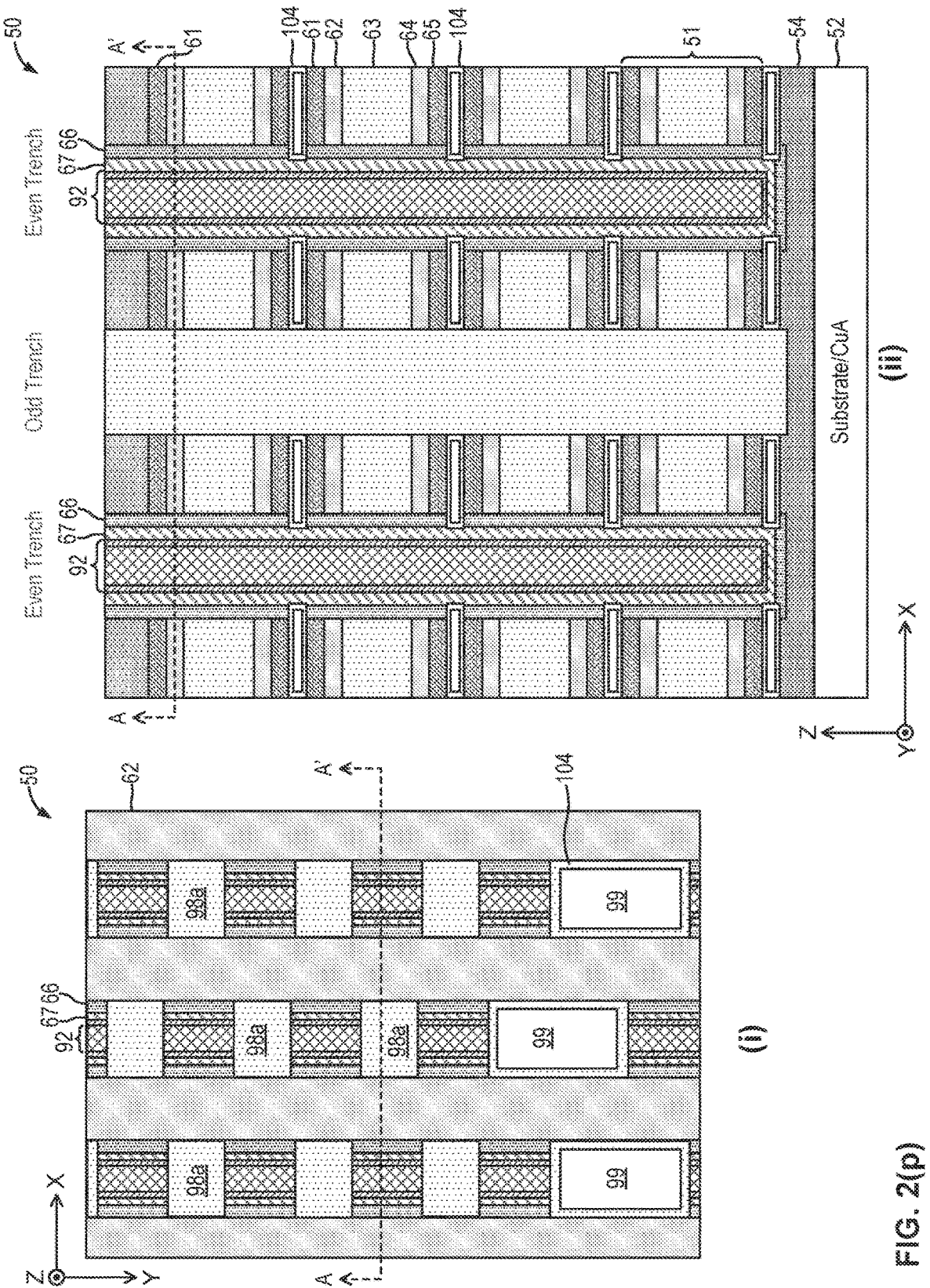
Figure 2Q:
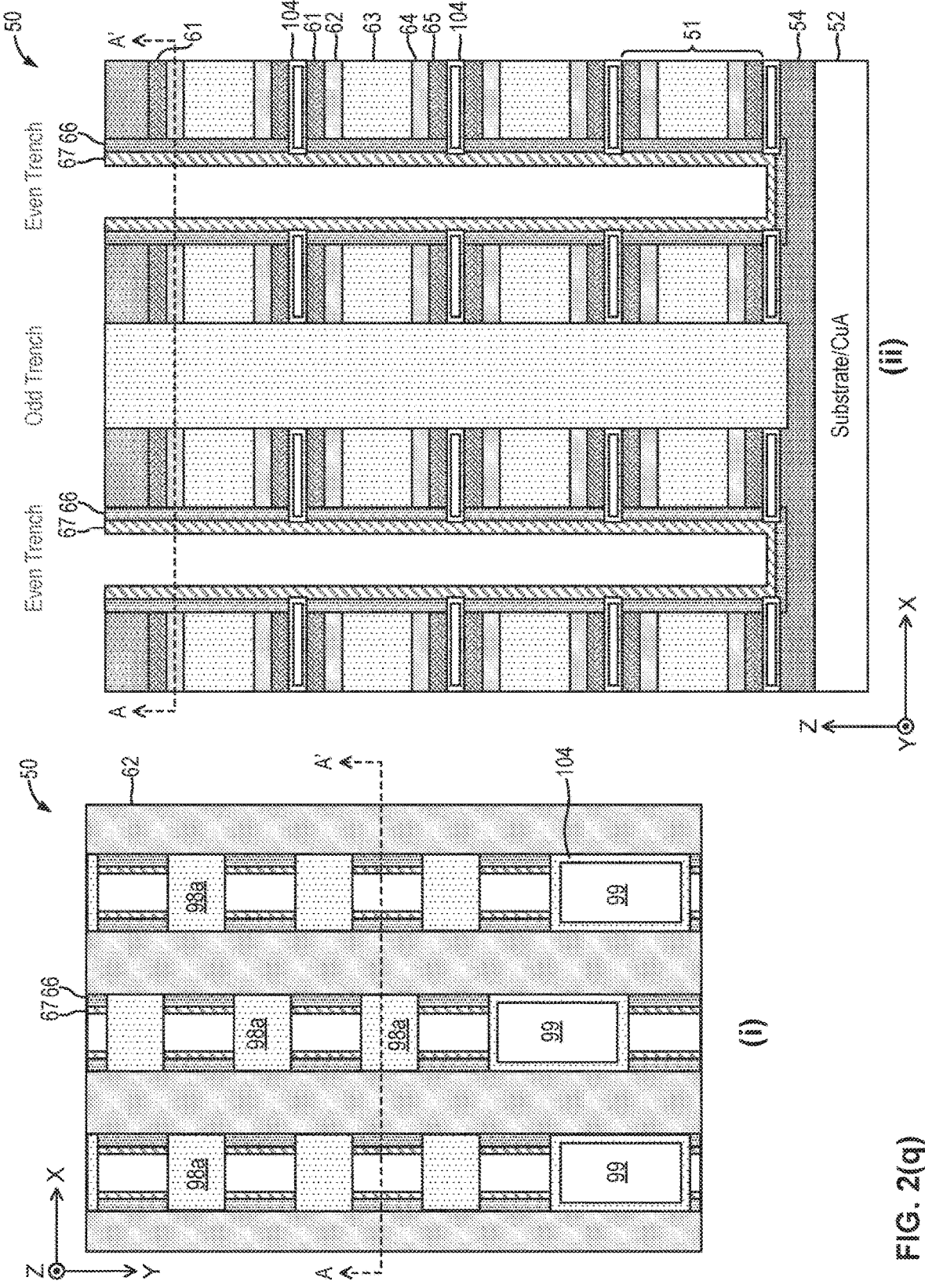
Figure 2R:
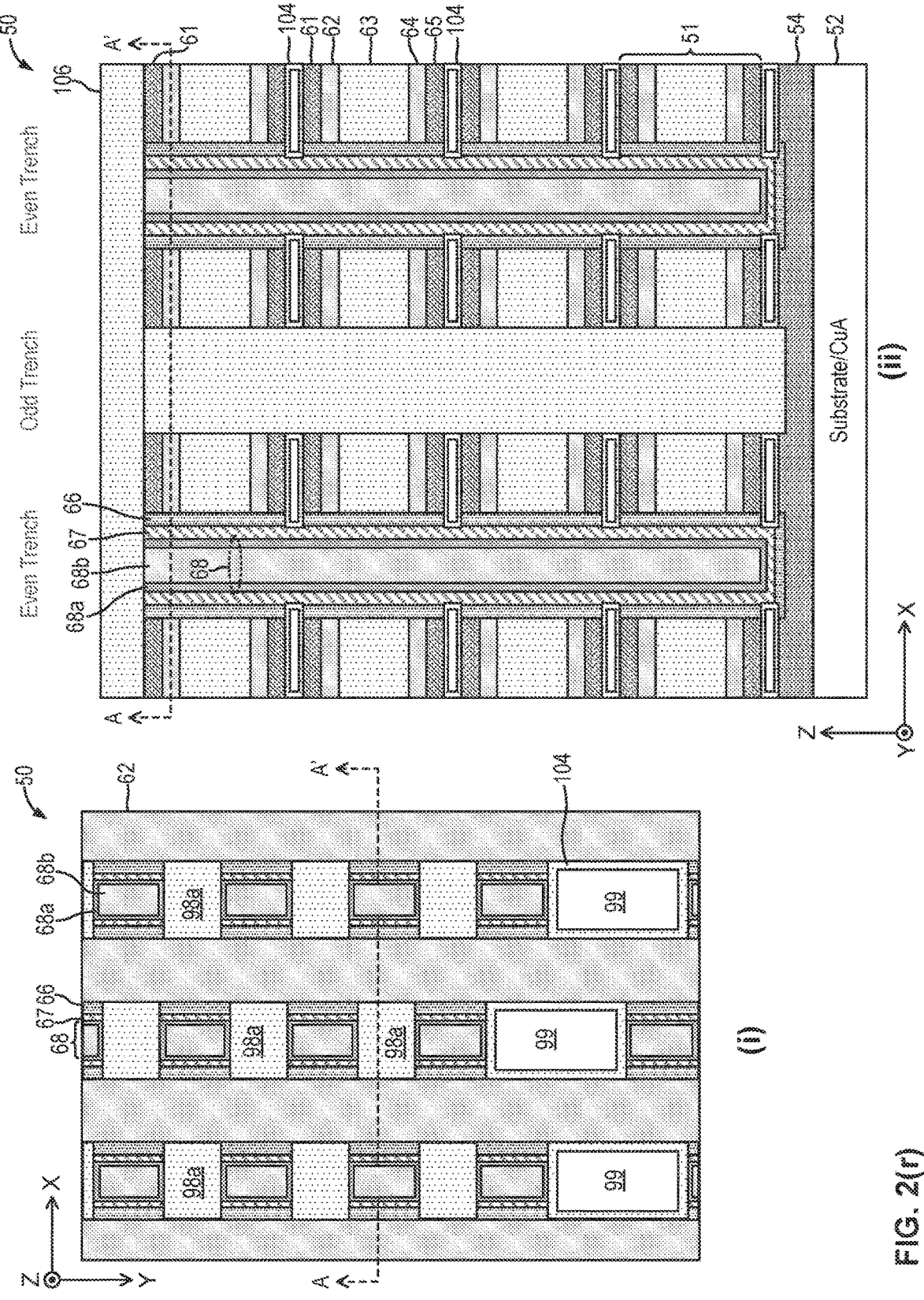
Figure 2S:
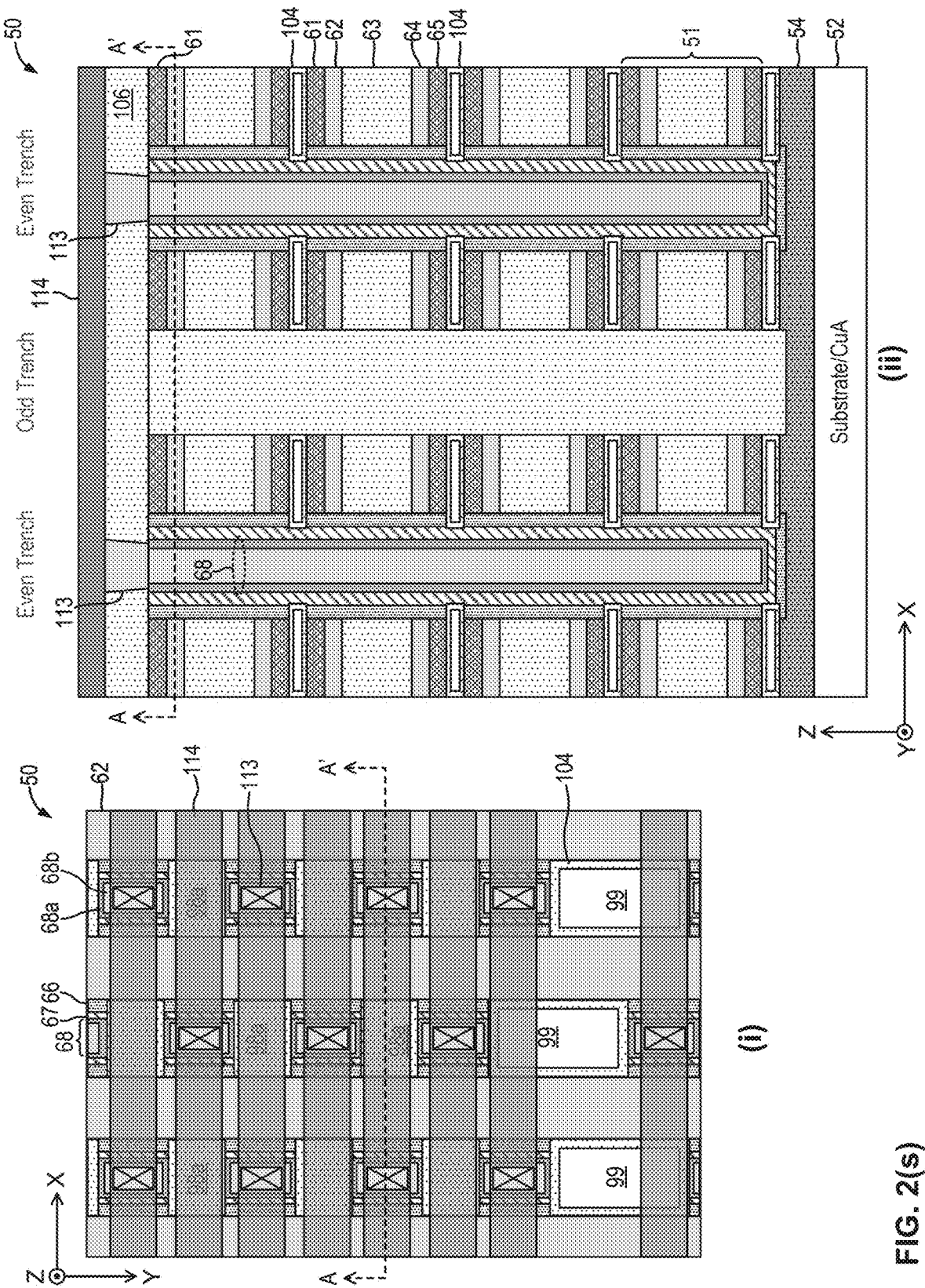

FIGS. 2(a) to 2(s), including FIGS. 2(l1) and 2(o1), illustrate a process for fabricating a memory structure including HNOR memory strings in embodiments of the present invention. Each figure in FIGS. 2(a) to 2(j), and 2(l) to 2(s) includes two views: view (i) is a horizontal cross-sectional view (i.e., in an X-Y plane) along A-A', or B-B', or C-C' in view (ii), and view (ii) is a vertical cross-sectional view (i.e., in an X-Z plane) along line A-A', or B-B', or C-C' in view (i).

Referring to FIG. 2(a), initially, a semiconductor substrate 52 is provided and any circuitry to be formed in the substrate 52, such as the CuA and the interconnect conductors, are fabricated in or on the substrate 52. An insulating layer 54 is provided on top of the semiconductor substrate to cover and protect the circuitry formed on and in the semiconductor substrate 52. In some embodiments, the insulating layer 54 is a dielectric layer which may also serve as an etch stop layer for the subsequent processing steps. In some embodiments, the insulating layer 54 is a silicon oxycarbide (SiOC) layer or an aluminum oxide ($Al_2O_3$) layer. The insulating layer 54 can be formed using any material with suitable selectivity for the subsequent etch processes to be performed.

Subsequently, a memory structure 50 is formed by successive depositions of (i) a multilayer 51 and (ii) an inter-layer sacrificial layer 70 on the planar surface of a semiconductor substrate 52, or in particular, on the insulating layer 54. The multilayer 51 includes (a) a first n-type semiconductor layer 61, (b) a first sacrificial layer 72, (c) a channel spacer dielectric layer 63, (d) a second sacrificial layer 74, and (e) a second n-type semiconductor layer 65, in this order in the Z-direction. FIG. 2(a) shows the memory structure 50 after the depositions of the initial layers of thin films. Multilayer 51 is also referred to in this detailed description as an "active layer." View (i) in FIG. 2(a) illustrates the horizontal cross-section along a line A-A' in the first sacrificial layer 72 in view (ii). View (ii) in FIG. 2(a) illustrates the vertical cross-section of the memory structure 50 along the line A-A' shown in view (i). The first and second sacrificial layers 72 and 74 are to be replaced by respective conductive layers in subsequent processing. The inter-layer sacrificial layer 70 (also referred herein as the third sacrificial layer) is to be replaced by an isolation material in subsequent processing to form an inter-layer isolation layer.

In some embodiments, the first and second n-type semiconductor layers 61, 65 are each a heavily doped n-type polysilicon layer. In some examples, the first and second n-type semiconductor layers 61, 65 are deposited as amorphous silicon layers and doped with n-type dopants. Subsequent annealing or thermal processing converts the amorphous silicon layers into polysilicon layers and activates the n-type dopants. In one embodiment, the semiconductor layers 61, 65 are phosphorus doped polysilicon layers. Furthermore, in some embodiments, the first and second semiconductor layers 61, 65 are doped with phosphorus to a doping level of $5\times10^{19}$ to $1\times10^{20}$ $cm^{-3}$. The doping level is selected to ensure a sufficient ohmic contact to the first and second conductive layers to be formed and also to limit the amount of lateral doping into the channel layer to be formed. The first and second sacrificial layers 72 and 74 are each a silicon nitride layer. The channel spacer dielectric layer 63 is an insulating dielectric material, such as silicon dioxide ($SiO_2$). The third sacrificial layer 70 is a sacrificial layer selected from carbon, amorphous silicon (aSi), and silicon germanium (SiGe).

In one embodiment, the third sacrificial layer 70 may be, for example, a 30 nm thick carbon layer. The first and second semiconductor layers 61, 65 may be, for example, each a 30 nm thick phosphorus-doped polysilicon layer. The first and second sacrificial layers 72, 74 may be, for example, each a 30 nm thick silicon nitride layer. The channel spacer dielectric layer 63 may be, for example, a 100 nm thick silicon dioxide layer. In the present description, the dimensions are provided merely for illustrative purposes and are not intended to be limiting. In actual implementation, any suitable thicknesses or dimensions may be used.

After the memory structure is formed with the desired number of multilayers with the third sacrificial layers therebetween, a hard mask 76 is formed on the top of the memory structure. In one embodiment, the hard mask 76 is a silicon oxycarbide layer (SiOC). The hard mask is patterned to define trenches in which storage transistors are to be formed, for example, using a photo-lithographical patterning step. In particular, the hard mask defines a set of even trenches and a set of odd trenches. In one example, the trenches have a width of 60 nm and a pitch of 100 nm. After the hard mask 76 is patterned, a second mask 78 is formed over the hard mask 76 which covers exposed areas in the hard mask 76 corresponding to the even trenches. The processing that follows will be performed first in the areas associated with the odd trenches exposed by the second mask 78. Processing in the areas associated the even trenches will be performed in a later stage when the second mask 78 is removed. In some embodiments, the second mask 78 maybe planarized to the surface of the hard mask 76, as shown by the dotted line in FIG. 2(a).

Referring to FIG. 2(b), a first set of trenches 80 are formed in memory structure 50 using, for example, a selective anisotropic etch process with the hard mask 76 and the second mask 78 as the masking layer. The first set of trenches 80 is referred to as the odd trenches. In some examples, the trenches 80 may be 60 nm wide, with a spacing of 160 nm apart, that is, the mesa formed between two adjacent trenches is 160 nm. Subsequently, referring to FIG. 2(c), a channel layer 66 is deposited conformally on the sidewall of the trenches 80. In one embodiment, the channel layer 66 is a lightly doped p-type polysilicon layer. In some examples, the channel layer 66 is deposited as a boron doped amorphous silicon layer and may have a thickness of about 8 nm. In some embodiments, the channel layer 66 is a polysilicon layer doped with boron to a doping level of $2 \times 10^{18}$ to $3 \times 10^{18}$ cm$^{-3}$. In one embodiment, the channel layer 66 may be doped more heavily with p-type dopants to compensate for the later lateral diffusion of n-type dopants from the source and drain semiconductor layers. A dielectric liner layer 81 is deposited to cover the channel layer 66 and the remaining volume in the trenches 80 is filled with a sacrificial material 82. To best protect channel layer 66, liner layer 81 is preferably deposited in the same deposition tool to avoid exposure of the channel to oxidation. In one embodiment, the liner layer 81 can be a low temperature (under 500° C.) silicon nitride layer and have a thickness of 3 nm. Alternately, the liner layer 81 can be an undoped amorphous silicon layer. In some embodiments, the sacrificial material 82 can be one of silicon germanium, phosphosilicate glass (PSG) or borophosphosilicate glass (BPSG) or silicon oxide (SiO$_2$). After the deposition steps, excess material may be removed from the top of memory structure 50 using, for example, chemical-mechanical polishing (CMP). The second mask 78 is removed with the hard mask 76 remaining. The resulting memory structure 50 is shown in FIG. 2(c).

Referring to FIG. 2(d), a third mask 83 is applied and patterned to cover the odd trenches while exposing openings where the even trenches are defined by the hark mask 76. With the mechanical support from the sacrificial material 82, a second set of trenches 84 are then formed using substantially the same technique as discussed in conjunction with FIG. 2(b) above. For example, the memory structure is selective anisotropically etched with the hard mask 76 and the third mask 83 as the masking layer. The second set of trenches 84 is referred to as the even trenches. In some examples, the trenches 84 may be 60 nm wide. Each of the second set of trenches 84 is cut between an adjacent pair of the first set of trenches 80 and each of the second set of trenches 84 is cut substantially equidistant between an adjacent pair of the first set of trenches 80. As a result of trenches 80 and 84 being cut in the multilayer structure, stacks in the multilayer structure are formed which are referred to as "active stacks" in the present description. In some examples, the active stacks are each approximately 40 nm wide. The resulting narrow strips in each plane resulting from the cutting of the active layers 51 are referred herein as "active strips."

Thereafter, first and second sacrificial layers 72 and 74 are removed using, for example, a selective wet etch through access using trenches 84, thereby creating cavities between the channel spacer dielectric layer 63 and respective first and second semiconductor layers 61, 65. The cavities are filled by first and second conductive layers 62 and 64, as shown in FIG. 2(e). The interface between conductive layers 62, 64 and the channel layer 66 should be cleaned of any surface oxidation while protecting the channel layer from damage. In some embodiments, the first and second conductive layers 62, 64 are formed using a low resistivity metallic conductive material. In some embodiments, the first and second conductive layers are metal layers, such as a titanium nitride (TiN)-lined tungsten (W) layer, a tungsten nitride (WN)-lined tungsten (W) layer, a molybdenum nitride (MoN) lined molybdenum (Mo) layer, or a liner-less tungsten or molybdenum or cobalt layer, or other metal layers. In one example, the first and second conductive layers 62 and 64 are each formed by successively depositing a titanium nitride (TiN) liner and a tungsten (W) layer. The TIN liner may be formed using, for example, an atomic layer deposition (ALD) technique and the tungsten layer may be formed using, for example, CVD or PECVD techniques. An etching step removes the deposited material from the sidewalls of trenches 84. In some examples, an isotropic wet etch is used to remove the deposited material from the sidewalls of trenches 84. The resulting memory structure 50 is shown in FIG. 2(e). The third mask 83 is then removed.

Subsequently, referring to FIG. 2(f), a channel layer 66 is deposited on the sidewall of trenches 84. For example, the channel layer 66 is a lightly doped p-type polysilicon layer. In the same manner as the odd trenches 80, a dielectric liner layer 81, such as a silicon nitride liner layer, is deposited to cover the channel layer 66 and the remaining volume in the trenches 84 is filled with a sacrificial material 82, such as silicon germanium. After the deposition steps, excess material may be removed from the top of memory structure 50 using, for example, chemical-mechanical polishing (CMP). The resulting memory structure 50 is shown in FIG. 2(f). In some embodiments, annealing is performed after the channel layer is formed in both the even and the odd trenches so that a single annealing step can be used to convert the material and activate the dopants in the polysilicon layer. For example, an anneal at 630° C. may be performed after the channel layer is formed in both the odd and even trenches. As thus formed, the first and second semiconductor layers 61 and 65 provide the common drain line and the common source line of an HNOR memory string to be formed. Conductive layers 62 and 64 reduce the resistivity of the adjacent common source line or common bit line they contact.

It is instructive to note that in the multilayer 51, the first and second sacrificial layers 72, 74 are provided between the channel spacer dielectric layer 63 and the respective first and second semiconductor layers 61 and 65. When replaced with the first and second conductive layers 62, 64, each conductive layer is formed between the channel spacer dielectric layer 63 and the semiconductor layer the conductive layer contacts. Accordingly, in each multilayer 51, the first and second semiconductor layers 61 and 65 are spaced apart by the channel spacer dielectric layer 63 as well as the first and second conductive layers 62, 64.

In embodiments of the present disclosure, the memory structure 50 may include non-memory transistors to support operation of the storage transistors. For example, the storage transistors are formed with charge storage layers or ferroelectric polarization layers to form non-volatile or quasi-volatile memory transistors. However, to facilitate the operation of the storage transistors, precharge transistors are provided along each memory string and the precharge transistors maybe formed as non-memory transistors. For example, the precharge transistors may be MOSFET devices formed with a gate dielectric layer and not a charge storage layer or ferroelectric polarization layer. In some embodiments, the process for fabricating the memory structure 50 of HNOR memory strings further includes fabrication process steps for forming precharge transistors in the HNOR memory strings. In particular, to facilitate the operation of the storage transistors, precharge transistors are provided at given locations along each HNOR memory string where the precharge transistors are used to bias the common source line or the common bit line of a HNOR memory string to a desired voltage. In one example, 3-5 precharge transistors may be provided in a NOR memory strings of 2000 storage transistors.

More specifically, the memory structure 50 of the present invention forms three-dimensional array of NOR memory strings of storage transistors. The storage transistors in each NOR memory string share the common source line and the common drain line (common bit line). The voltage on each shared common source line can be separately applied directly from one or both ends of each source line in the three-dimensional structure. In some embodiments, the shared common source line is electrically floating and the source voltage is applied from the common bit line using precharge transistors so as to obviate the need to provide connector wires to the source lines at the staircase portions of the three-dimensional structure. In one embodiment, the source voltage on a given source line is set to a desired voltage value (such as the ground voltage) through a precharge operation using one or more precharge transistors formed along the memory string and the source line is then left floating after the precharge operation. In particular, the precharge operation set the common bit line to a desired voltage and then the precharge transistor is momentarily turned on to short the common bit line to the common source line to transfer the bit line voltage to the source line. As a result, the common source line is charged from the voltage on the common bit line to a voltage to equal to the bit line voltage. After the precharge operation is complete, the precharge transistor(s) is turned off. The common source line maintains a relatively constant voltage through the parasitic capacitance at the source terminals, such as the parasitic capacitance between the source terminals and the numerous local word line gate terminals of the storage transistors in the NOR memory string.

FIG. 2(*g*) illustrates the memory structure 50 after the processing steps described above for forming the storage transistors in multiple layers of HNOR memory strings. The HNOR memory strings are formed extending in the Y-direction. At given locations along the memory strings, precharge transistors 112 are provided. The precharge transistors have extended dimensions in the Y-direction to form precharge transistors with a larger channel width to provide sufficient current drive. That is, the precharge transistors have channel width much larger than the channel width of the storage transistors. In some example, the channel width of the storage transistors may be 55 nm while the channel width of the precharge transistors may be 220 nm (in the Y-direction). In some embodiments, in a memory string of 2000 or more storage transistors, 4-5 precharge transistors may be provisioned along each memory string.

To form the precharge transistors in the memory structure, a mask is applied to the memory structure 50 to cover all of the memory string with mask openings 85 exposing locations where the precharge transistors are to be formed, as shown in FIG. 2(*g*). In some embodiments, the mask may be a silicon mask. Using the mask defined openings 85, the sacrificial material 82 is removed and the liner layer 81 is also removed, such as by one or more selective wet etch steps. The channel layer 66 remains on the sidewall of the active stacks and will be used to form the channel regions of the precharge transistors. Cavities are formed in the trenches between the active stacks. A gate dielectric layer 86 is then deposited on the sidewalls of the cavities. In one embodiment, the gate dielectric layer 86 is a silicon oxide layer or a hafnium oxide layer. In some examples, the gate dielectric layer 86 is a high temperature oxide (HTO). In another example, the gate dielectric layer 86 may include a high-K dielectric layer, such as 3-5 nm of silicon nitride, to fortify the gate dielectric layer. Then, the remaining areas of the cavities, lined with the gate dielectric layer 86, are filled by a conductive layer forming the gate conductor of the precharge transistors. The gate conductor may include successively deposited titanium nitride (TiN) layer 87 and a heavily doped polysilicon or tungsten (W) layer 88. Excess deposited materials may be removed from the top of memory structure 50 by CMP. FIG. 2(*g*) illustrates the resulting precharge transistors 112 thus formed. View (i) in FIG. 2(*g*) illustrates the horizontal cross-section along a line B-B' in the first conductive layer 62 in view (ii). View (ii) in FIG. 2(*g*) illustrates the vertical cross-section of the precharge transistors along the line B-B' shown in view (i).

The fabrication process of memory structure 50 may then return to forming the storage transistors. It is understood that the areas where the precharge transistors are formed are masked or covered, or otherwise protected from the following processing steps. Referring to FIG. 2(*h*), the sacrificial material 82 and the silicon nitride liner layer 81 are removed, exposing both even and odd trenches 90. The channel layer 66 remains on the sidewalls of the trenches 90. The fabrication process then proceeds to form the gate dielectric layer of the storage transistors. Referring to FIG. 2(*i*), a gate dielectric layer 67 is deposited onto the sidewalls of the trenches 90. Remaining volume in trenches 90 is filled with a silicon nitride liner layer and a sacrificial material (such as silicon germanium). The liner layer and the sacrificial material is collectively referred to as a sacrificial material 92. The resulting memory structure 50 is shown in FIG. 2(*i*).

In one embodiment, the memory structure 50 is used to form charge-trap type storage transistors and the gate dielectric layer 67 is a charge storage layer. In one embodiment, the charge storage layer includes a tunneling dielectric layer, such as silicon oxide or oxynitride, a charge-trapping layer, such as silicon-rich nitride, and a blocking layer, such as silicon oxide or aluminum oxide, arranged in this order with the tunneling dielectric layer formed adjacent to the channel layer 66. Such a charge storage film is referred to as an ONO layer. In other embodiments, the charge storage layer is a multi-layer that includes, for example, (i) a 1-nm thick tunneling dielectric layer (e.g., silicon dioxide ($SiO_2$)); (ii) a 6-nm thick charge-trapping multilayer that includes zirconium oxide (ZrO), silicon nitride ($Si_3N_4$) and silicon dioxide $SiO_2$; and (iii) a 3-nm thick blocking layer (e.g., $Al_2O_3$). The charge storage layer 67 is sometimes referred to as an "OZNOA" layer. In some embodiments, the charge storage layer 67 is deposited using an atomic layer deposition (ALD) technique with subsequent anneal process. In some embodiments, a pulse anneal, such as 10 seconds at 850° C., may be used or plasma anneal (less then 550° C.) may be used to reduced the total thermal budget of the fabrication process.

In some embodiments, the charge storage layer may be deposited with only the tunneling dielectric layer and the charge trapping film. The blocking layer maybe deposited in later steps, such as just before the gate conductor layer is formed. In this manner, the fabrication process can avoid introducing undesirable contaminants from the blocking layer during early part of the processing. In one example, the blocking layer is an aluminum oxide layer and is not formed at the present stage of processing. The aluminum oxide blocking layer is formed later on before deposition of the gate conductor layer.

In another embodiment, the memory structure 50 is used to form ferroelectric storage transistors and the gate dielectric layer 67 is a ferroelectric gate dielectric layer or ferroelectric polarization layer. The ferroelectric polarization layer can be deposited using an atomic layer deposition (ALD) technique and may have a thickness between 2 nm to 8 nm. A thermal anneal is performed to form the ferroelectric phase in the deposited ferroelectric material. In one embodiment, the ferroelectric gate dielectric layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric gate dielectric layer is a material selected from: zirconium-doped hafnium oxide (HZO), silicon-doped hafnium oxide (HSO), aluminum zirconium-doped hafnium oxide (HfZrAlO), aluminum-doped hafnium oxide ($HfO_2$:Al), lanthanum-doped hafnium oxide ($HfO_2$:La), hafnium zirconium oxynitride (HfZrON), hafnium zirconium aluminum oxide (HfZrAlO), and any hafnium oxide that includes zirconium impurities.

In some embodiments, an interfacial layer may be provided between the channel layer 66 and the gate dielectric layer 67. In some embodiments, the interfacial layer is formed using a material with a high dielectric constant (K) (also referred to as "high-K" material). In the present description, a material with a high dielectric constant or a high-K material refers to a material with a dielectric constant greater than the dielectric constant of silicon dioxide. In some embodiments, the interfacial layer may be a silicon nitride ($Si_3N_4$) layer, or a silicon oxynitride layer, or an aluminum oxide ($Al_2O_3$) layer. Other materials for the interfacial layer 65 may be indium tungsten oxide. In some embodiments, the interfacial layer may be deposited using an atomic layer deposition (ALD) technique and furthermore, in some embodiments, the interfacial layer may be deposited in the same process chamber as the ferroelectric polarization layer, without breaking vacuum between the deposition of the two layers. The interfacial layer may have a thickness of 0.5 nm-2 nm. In one embodiment, the interfacial layer is an aluminum oxide ($Al_2O_3$) layer and is annealed to yield an amorphous film with the desired characteristics. In some embodiments, the aluminum oxide ($Al_2O_3$) layer can be annealed in oxygen ($O_2$), ozone ($O_3$), nitrous oxide ($N_2O$), forming gas ($H_2N_2$), or argon (Ar).

In the above-described embodiments, the channel layer 66 is formed after the set of odd and even trenches are made (FIGS. 2(*c*) and 2(*f*)) and then protected by sacrificial materials and subsequently processing removes the sacrificial materials to form the gate dielectric layer 67 on the channel layer 66 (FIG. 2(*i*)). In some embodiments, the gate dielectric layer can be formed at the same time as the channel layer 66, thereby to avoid oxidation of the channel layer 66 if exposed to oxygen or during elevated temperature anneals. In some cases, the two layers can be formed in the same process chamber without breaking vacuum which makes it more efficient to form the two layers at the same time. Accordingly, in alternate embodiments, in each of the steps above when the channel layer 66 is formed, the gate dielectric layer 67 is formed immediately thereafter and both layers are then protected by the liner layer 81 and the trenches are filled with the sacrificial material 82.

Thereafter, the memory structure 50 is patterned to form the local word line structures. Referring to FIG. 2(*j*), a mask is applied to the memory structure 50 with openings 94 exposing areas for isolating the storage transistors along a memory string. In embodiments of the present invention, the openings 94 includes a first set of openings 94*a* defining isolation area between storage transistors. In some embodiments, the openings 94*a* may be 45 nm wide in the Y-direction and the openings 94*a* may be spaced apart by 55 nm. The openings 94 further includes a second set of openings 94*b* having extended width in the Y-direction. The openings 94*b* are to be used to perform channel separation in later stage of the fabrication process, as will be described in more details below. In one embodiment, the openings 94*b* may be 100 nm to 120 nm wide in the Y-direction. In some embodiments, one opening 94*b* is provided for every N number of openings 94*a*. For example, one opening 94*b* is provided for every 16 openings 94*a*.

With the openings 94 thus defined, the sacrificial material 92, the gate dielectric layer 67 and the channel layer 66 are removed from the areas defined by the exposed openings, as shown in FIG. 2(*j*). Shafts 95*a* are formed from mask openings 94*a* and shafts 95*b* are formed from mask openings 94*b*. In one embodiment, a selective anisotropic etch may be used to form shafts 95*a* and 95*b*. In some embodiments, the mask openings 94 overlap the active stacks and the etch process is self-aligned to the edges of the active stacks. FIG. 2(*k*) is another view of the memory structure 50 illustrating the openings 94*a* and 94*b* and the precharge transistors 112 and the shafts 95*a* and 95*b* formed therefrom. Referring to FIG. 2(*k*), storage transistors are formed along each active strip in the Y-direction, in the spaces between adjacent shafts 95*a*. Extended shafts 95*b* are formed at selected locations to form access openings for selectively etching the channel layer for channel separation, as will be described in more details below. In some embodiments, one extended shaft 95*b* is provided is provided for every N number of regular shafts 95*a*. In one example, the extended shafts 95*b* are provided once for every 16 regular shafts 95*a* along the memory string. In another example, the extended shafts 95*b* may be provided once every 1.6 μm along the memory string. As described above, along the memory string, several (e.g. 3-5) precharge transistors 112 (non-memory transistors) are provided to support memory operations in providing biasing of the common source line or common bit line.

In some embodiments, the etching of the channel layer 66 should be performed to limit any unintended sideway etch into the active stacks of active layers 51 at the face of the vertical sidewalls of the trenches that have become exposed to the etchant when the channel layer 66 has been etched away. In some cases, care can be taken to minimize excessive undercutting by sideway etching of the channel layer 66 or the gate dielectric layer 67.

Referring to FIG. 2(*l*), the shafts 95*a* and 95*b* are filled with a dielectric material 98, forming dielectric filled shafts 98*a* and 98*b*. For example, the dielectric material 98 can be silicon oxide ($SiO_2$). Each pair of dielectric filled shafts 98*a* define an area in which a pair of storage transistors are to be formed.

In the above-described embodiments, the channel layer 66 is removed during the etch process applied to mask openings 94*a* and 94*b* to form shafts 95*a* and 95*b*. As shown in FIG. 2(*l*)(*i*), the channel layer 66 is separated between adjacent shafts 98 and no channel layer remains in the shafts 98. In other embodiments, the etch process may remove only the sacrificial material 82 and the liner layer 81, without removing the channel layer 66. FIG. 2(*l*1) illustrates the alternate embodiment where the channel layer 66 is not removed from the shafts 95 and the subsequently formed dielectric filled shafts 98 (including shafts 98*a* and 98*b*) are bonded by the channel layer 66 in the X-direction. Accordingly, in memory structure 50*a*, the channel layer 66 is a continuous layer in the Y-direction along the NOR memory strings. The portions of the channel layer 66 remaining adjacent the dielectric filled shafts 98 have minimal impact on the operation of the storage transistors of the NOR memory strings.

With the dielectric filled shafts 98 thus formed, the fabrication process opens up the dielectric filled shafts 98*b* to use the inter-layer sacrificial layer 70 to perform separation of the channel layer 66 to each active layer. Referring to FIG. 2(*m*), the memory structure 50 is masked to protect all areas while exposing the shafts 98*b*. Then, the dielectric material is removed from shafts 98*b*, forming cavities 99. In one embodiment, the shafts 98*b* are etched using a selective anisotropic etch process. Furthermore, in some embodiments, the shafts 98*b* are etched using the selective anisotropic etch process to remove the dielectric materials in the main portion of the shafts and leaving spacers 98*c* on the ends of the shafts in the Y-direction to protect the channel layer and the gate dielectric layer formed in the narrow trenches adjacent the shafts 98*b*, as shown in FIG. 2(*m*). A further etch process, such as a selective wet etch process, can be performed to clean the surfaces of the active stacks in the excavated cavities 99. In this manner, the multilayers 51 and the inter-layer sacrificial layer 70 are exposed through the excavated cavities 99. View (i) in FIG. 2(*m*) illustrates the horizontal cross-section along a line C-C' in the first conductive layer 62 in view (ii) during the intermediate etch process. View (ii) in FIG. 2(*m*) illustrates the vertical cross-section of the memory structure 50 along the line C-C' shown in view (i).

Referring to FIG. 2(*n*), using the excavated cavities 99 as access shafts which exposes the multilayer 51 and the inter-layer sacrificial layer 70 from the sides of the active stacks, the fabrication process removes the inter-layer sacrificial layer 70, leaving cavities 102 in places where the inter-layer sacrificial layer used to be. Various removal processes can be used depending on the material used for the third sacrificial layer 70. For example, in the case the sacrificial layer 70 is a carbon layer, the carbon layer can be removed by ashing in an oxygen ambient. In the case the sacrificial layer 70 is amorphous silicon or silicon germanium, a selective wet etch process can be used. The resulting memory structure 50 is shown in FIG. 2(*n*). With the excavated cavities 102 formed, the remaining multilayers 51 are held in place by being attached to the channel layer 66, the gate dielectric layer 67, and the sacrificial material 92. Furthermore, the active stacks are supported by the dielectric filled shafts 98*a* formed in the narrow trenches between the active stacks and spaced throughout the length of the memory strings in the Y-direction.

As shown in FIG. 2(*n*), the excavated cavities 102 thus formed expose portions of the channel layer 66 between the multilayers 51 in the active stacks. In particular, the backside of the channel layer 66 is exposed between each multilayer 51. The cavities 102 can be used as access openings to remove the portions of the channel layer 66 that straddle two adjacent storage transistors formed by adjacent multilayers 51 in the active stack (in the Z-direction). Referring to FIG. 2(*o*), the fabrication process uses the cavities 102 to selectively etch or remove the exposed portions of channel layer 66, as indicated by the dotted circles in FIG. 2(*o*). As a result, the channel layer 66 is separated in the Z-direction to each multilayer 51. In one embodiment, the channel layer 66 is a p-type polysilicon layer and the polysilicon channel layer is etched through the cavities 102 using a selective wet etch process. The selective wet etch process preferably has a slow etch rate to remove the thin channel layer without over-etching the channel material adjacent the multilayer structures.

In the embodiment shown in FIG. 2(*o*), the channel separation process stops when the exposed portions of the channel layer 66 are removed and the channel region is physically separated and isolated to each active layer 51 in each active stack. In some embodiments, the channel separation process can continue, by a change of etchant chemistry or process, to remove the now exposed portions of the gate dielectric layer 67, as shown in FIG. 2(*o*1). In memory structure 50*b* of FIG. 2(*o*1), the gate dielectric layer 67, serving as the charge storage layer or the ferroelectric polarization layer of the storage transistors, is also physically separated and isolated to each active layer 51 in each active stack. The separation of the gate dielectric layer 67 is optional and may be omitted in other embodiments of the present invention. In some cases, care can be taken to minimize excessive undercutting by sideway etching of the channel layer 66 or the gate dielectric layer 67.

Referring to FIG. 2(*p*), after the channel separation process, the exposed surfaces of the memory structure 50 can be passivated, such as by forming a thin liner layer 104. The liner layer 104 is a thin dielectric layer, such as around 1-2 nm thick. The liner layer 104 can be a silicon oxide layer, a silicon nitride layer or an aluminum oxide layer and serves to passivate or seal the exposed surfaces in the cavities 102. The remaining portions of cavities 102 can be left unfilled and used as an air gap isolation layer. Alternately, the remaining portions of cavities 102 can be filled with a dielectric layer, such as silicon oxide. Furthermore, in the present embodiment, the excavated cavities 99 are provided with the liner layer 104 and are left unfilled to use as an air gap isolation. In other embodiments, the cavities 99 can be filled with a dielectric layer, such as silicon oxide.

Referring to FIG. 2(*q*), the sacrificial material 92, including any filler or liner material, is removed from the trenches 90, using a suitable selective wet or dry etch process. As a result, the gate dielectric layer 67 is exposed in the regions between adjacent dielectric filled shafts 98*a*. Referring to FIG. 2(r), the excavated cavities between adjacent shafts 98a are then filled with a conductive layer which forms the gate conductor layer 68. Note that in the case where the gate dielectric layer 67 is a charge storage film and the blocking layer is not yet formed, the block layer of the charge storage film is formed first on the gate dielectric layer 67 before the conductive layer of the gate conductor is formed.

In the present embodiment, the gate conductor layer 68 is a metal layer and can include successively deposited thin conductive liner 68a and conductive filler material 68b. The thin conductive liner 68a may be a titanium nitride (TiN) liner or a tungsten nitride (WN) liner. The thin liner layer 68a may be formed using, for example, an atomic layer deposition (ALD) technique. The conductive filler material 68b may be a metal, such as tungsten (W) layer or molybdenum (Mo), or heavily doped n-type or p-type polysilicon. The conductive filler material 68b may be deposited using CVD or PECVD techniques.

Between each pair of dielectric-filled trenches 98a, the conductive layer 68 provides a vertical local word line (LWL) that serves as gate electrode for each of the storage transistors that are vertically aligned in the same active stack. The structure resulting from the combination of the gate dielectric layer 67 and the conductive layer 68 is referred herein as the local word line (LWL) structure. Excess deposited materials may be removed from the top of memory structure 50 by CMP. A cap oxide layer 106 may be formed above the memory structure 50. FIG. 2(r) illustrates the resulting memory structure 50. The memory structure 50 thus formed includes storage transistors arranged in NOR memory strings in multiple planes. In particular, the storage transistors have the same structure as the storage transistor 20 as described in FIG. 1.

Vias and interconnects are formed in and above the cap oxide layer 106 to form interconnection between the storage transistors and the control circuitry, such as the CuA formed in the substrate 52. For example, the bit lines and local word lines of the memory stack are connected with control, select, and sense circuits that are formed in the CuA in the semiconductor substrate. In one example, global word lines, formed using copper metallization processes and materials, can be formed above the cap oxide layer 106 to connect the local word lines 68 to the respective word line drivers formed in the CuA in the substrate 52. FIG. 2(s) illustrates the memory structure 50 with a global word line metallization layer 114 formed on the cap oxide layer 106 and connected to local word lines 68 formed in the memory structure through vias 113 formed in the cap oxide layer 106. In some embodiments, the global word line metallization layer 114 is one of copper, tungsten, molybdenum, cobalt, or other metals, or compounds thereof. Vias 113 is filled with a metal layer, such as copper or other suitable metals. As thus configured, each global word line 114 is connected to a group of local word lines 68 to provide the control signal to the gate electrodes of the storage transistors formed in multiple memory planes associated with the respective vertical local word lines. More specifically, the global word lines 114 runs in the X-direction, perpendicular to the common bit lines 62 which runs in the Y-direction. Each global word line connects to the local word lines arranged in a row across the X-direction, as shown in FIG. 2(s)(i). Meanwhile, the bit lines from different memory planes of each active stack are connected to bit line selectors through a staircase structure provided in the Y-direction. The bit line selectors connect the bit lines to their respective sense amplifiers and voltage drivers circuit formed in the CuA, typically formed under the staircase structure.

It is instructive to note that FIG. 2(s) is illustrative only and is not intended to depict the exact vias and global word line interconnect structures. For example, the vias 113 connecting the local word lines 68 to the global word lines 114 need to be isolated from the channel layer so as not to short the gate electrode to the channel region of the storage transistors. Various methods for forming the vias 113 while providing isolation are possible. In one example, the channel layer 66 may be recessed from the top of the memory array. In another example, additional dummy layers maybe included in the memory structure above the array (in the Z-direction) to terminate the channel layer while extending each gate conductor layer 68 for connection to a via 113.

In the embodiment shown in FIG. 2(s), as a result of the channel separation process in the Z-direction using the cavities 102 and as a result of the shafts 98a formed between the LWL structures, each storage transistor thus formed is isolated in the Z-direction from other storage transistors in other planes of the same active stack. Each storage transistor is also isolated in the Y-direction from other storage transistors by the dielectric filled shafts 98a. Each storage transistor in the memory structure 50 is therefore completely isolated to enhance the performance characteristics of the storage transistors. Furthermore, air gap isolation is used to isolate the storage transistors in the active stacks between memory planes where the air gaps provide better isolation characteristics than most dielectric materials.

Furthermore, the memory structure 50 as thus fabricated enables the use of phosphorus as the n-type dopants for the first and second semiconductor layers because the multilayer configuration provides a long lateral diffusion path for the first and second semiconductor layers into the channel region. By placing the conductive layer between the respective first or second semiconductor layer and the channel spacer dielectric layer, the distance for the source/drain lateral diffusion is extended. In this manner, the lateral diffusion of dopants from the first and second semiconductor layers (the source and drain layers) into the channel region shortens the channel length but does not short out the channel. The memory structure can thus be formed using more readily available n-type dopants, such as phosphorus, instead of arsenic. As described above, the doping concentration of the first and second semiconductor layers is selected to optimize the amount of lateral diffusion into the channel region while preserving the ohmic contact characteristics between the semiconductor layer and the conducive layer it contacts.

FIG. 3 illustrates a memory structure formed using dummy layers for isolating the channel layer for global word line connections in some embodiments. Referring to FIG. 3, the memory structure 150 includes a dummy isolation layer 154 and a dummy dielectric layer 156. In the initial stack formation, the dummy isolation layer 154 can be provided as an inter-layer sacrificial layer described above (e.g. FIG. 2(a)) which is subsequently replaced by the inter-layer isolation layer, such as an air gap isolation. The dummy dielectric layer 156 functions as a capping layer for the dummy isolation layer 154 during the replacement process. In particular, during intermediate processing steps, the dummy isolation layer 154, as an inter-layer sacrificial layer, is removed to provide access openings to the backside of the channel layer 66. The channel layer 66 is selectively etched through the access openings. Then, the liner layer 104 is formed around the exposed cavities of the dummy isolation layer 154, the remaining portion forming an air gap isolation. As thus constructed, the channel layer for the topmost memory strings in the memory structure 150 is separated and isolated by the dummy isolation layer 154. A cap oxide layer 106 is formed above the memory structure 150. Vias 113 can be formed to contact the local word lines (gate conductor layer 68) without concern for possible electrical shorts to the channel layer. A metallization layer is formed on the cap oxide layer 106 to form the global word lines. Each global word line connects to the local word lines through vias 113 to provide the control signal to the gate electrodes of the storage transistors formed in multiple memory planes associated with the respective vertical local word lines.

Figure 4:
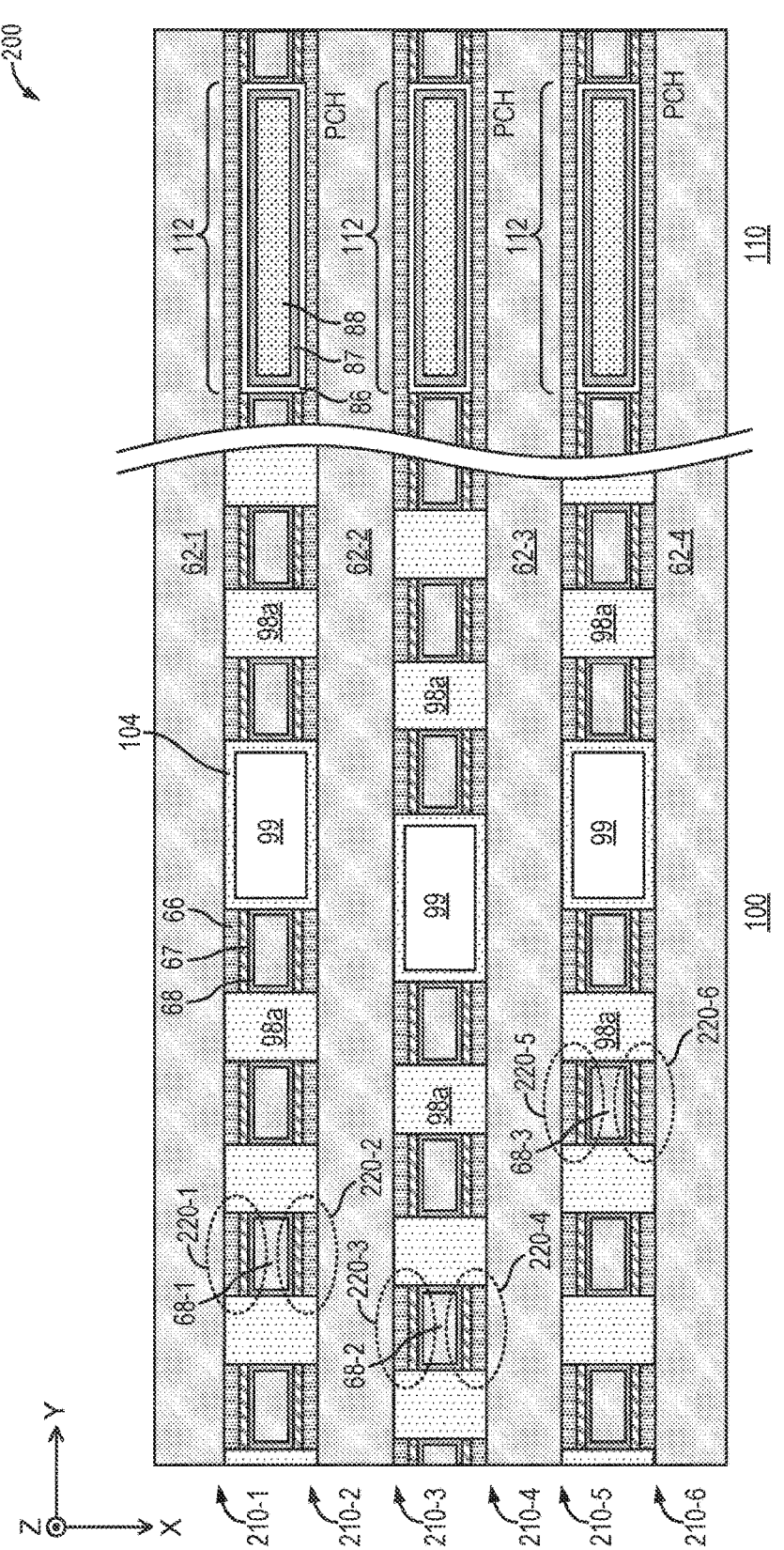
FIG. 4 is a cross-sectional view of a portion of a memory structure in the X-Y plane illustrating NOR memory strings with precharge transistors in embodiments of the present invention.

FIG. 4 is a cross-sectional view of a portion of a memory structure in the X-Y plane illustrating NOR memory strings with precharge transistors in embodiments of the present invention. Referring to FIG. 4, a memory structure 200 includes active stacks bordering narrow trenches with local word line structures formed therein. In the present illustration, the cross-sectional view is taken at the first conductive layer 62 of a given active layer in an active stack. The first conductive layer 62 forms the common bit line of the memory string. A storage transistor 220 is formed at the intersection of the common bit line 62 with the channel layer 66, the gate dielectric layer 67 and the gate conductor 68. FIG. 4 illustrates six memory strings 210-1 to 210-6 that are formed extending in the Y-direction along four active stacks (represented by respective first conductive layer 62-1 to 62-4). For example, each memory string 210 includes the storage transistors 220 formed along the active stack 62 and intersecting with all of the local word line structures along the active stack 62. The storage transistors 220 are isolated from other storage transistors in the memory string by the dielectric filled shafts 98a. Access shafts with cavities 99 lined with the liner layer 104 are used during the fabrication process to perform channel separation to isolate the channel layer 66 to each memory plane (in the Z-direction). Cavities 99 are left unfilled in the present embodiment and can function as an air gap isolation. Precharge transistors 112 are formed along each memory string to support the precharge operation.

It is instructive to note that in memory structure 200, a pair of memory strings 210 in each memory plane bordering a narrow trench including LWL structures have corresponding storage transistors sharing a local word line. Accordingly, each local word line activates two storage transistors in the memory strings bordering the same LWL structure in each memory plane. In one example, in response to the local word line 68-1 being selected, storage transistors 220-1 and 220-2 associated with respective memory strings 210-1 and 210-2 are activated. The common bit lines 62-1 and 62-2 are in turn selected to provide access and the appropriate voltages to the activated storage transistors 220-1 and 220-2. In another example, in response to the local word line 68-2 being selected, storage transistors 220-3 and 220-4 associated with respective memory strings 210-3 and 210-4 are activated. The common bit lines 62-3 and 62-4 are in turn selected to provide access and appropriate voltages to the activated storage transistors 220-3 and 220-4. In some embodiments, when storage transistor 220-1 is to be erased, transistor 220-2, which may be in a programmed state, needs to be protected from being erased as well. As an example of a typical erase operation of a ferroelectric storage transistor 220-1, the erase operation may require 3.0 volts applied to the local word line 68-1, and 0.0 Volts applied to its bit line 62-1. To prevent erasing of ferroelectric transistor 220-2 (that shares the same local word line 68-1 and therefore has the same 3.0 volts on its control gate), its bit line 62-2 must be held at an inhibit voltage Vinhb that is close enough to 3.0V to avoid flipping of the polarization state of ferroelectric type storage transistor 220-2. The same applies to all program and program inhibit operations, as well as for inhibiting disturbing the stored data of storage transistors on different planes above or below the plane being accessed, that are not being addressed yet are still being exposed to the voltage on their shared local word lines.

In the present description, spatially relative terms, such as "beneath," "below," "lower," "above," "upper" and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A three-dimensional memory structure formed above a planar surface of a semiconductor substrate, the memory structure comprising:

a plurality of thin-film storage transistors being organized as a plurality of stacks of NOR memory strings, the storage transistors within each NOR memory string sharing a common source layer and a common drain layer, spaced apart by a first isolation layer, with each layer extending along a first direction, the common source layer and the common drain layer each comprising a semiconductor layer of a first conductivity type and a conductive layer, the conductive layer being formed between the first isolation layer and the respective semiconductor layer and comprising a metallic conductive material; wherein:

(i) each NOR memory string extends along the first direction that is substantially parallel to the planar surface of the semiconductor substrate, (ii) the NOR memory strings of each stack are (a) provided one on top of another along a second direction substantially normal to the planar surface, and (b) isolated one from the other memory string by a second isolation layer;

(iii) an additional semiconductor layer of a second conductivity is provided adjacent each stack of NOR memory strings and, with respect to each NOR memory string within the stack, in contact with the common source layer and the common drain layer of the NOR memory string, thus providing channel regions for the storage transistors of the NOR memory string;

(iv) a gate dielectric layer is provided adjacent the additional semiconductor layer; and (v) a plurality of conductors are provided between adjacent stacks of NOR memory strings, each conductor extending along the second direction, and each serving as a common gate electrode for a group of storage transistors in the NOR memory strings of the adjacent stacks.

2. The three-dimensional memory structure of claim 1, wherein, within a stack of NOR memory strings, the channel regions for the storage transistors of a first NOR memory string are separated from the channel regions for the storage transistors of a second adjacent NOR memory string in the same stack.

3. The three-dimensional memory structure of claim 2, wherein, within the stack of NOR memory strings, the channel regions for the storage transistors of a first NOR memory string are separated from the channel regions for the storage transistors of a second adjacent NOR memory string by the second isolation layer.

4. The three-dimensional memory structure of claim 3, wherein the second isolation layer comprises an air gap cavity.

5. The three-dimensional memory structure of claim 4, wherein the second isolation layer comprises a liner layer formed on exposed surfaces between memory strings within a stack of NOR memory strings and an air gap in the remaining cavity.

6. The three-dimensional memory structure of claim 1, wherein the semiconductor layer of each of the common source layer and the common drain layer comprises a n-type polysilicon layer having a doping level selected to form an ohmic contact with the respective conductive layer and to limit diffusion into the channel regions of the additional semiconductor layer.

7. The three-dimensional memory structure of claim 6, wherein the semiconductor layer of each of the common source layer and the common drain layer is doped with phosphorus to a doping level of $5\times10^{19}$ to $1\times10^{20}$ cm$^{-3}$.

8. The three-dimensional memory structure of claim 1, wherein the common source layer comprises a first semiconductor layer and a first conductive layer; and the common drain layer comprises a second semiconductor layer and a second conductive layer, the first semiconductor layer being separated from the second semiconductor layer by the first and second conductive layers and the first isolation layer, each storage transistor having a channel length less than a thickness of the first and second conductive layers and the first isolation layer in the second direction.

9. The three-dimensional memory structure of claim 1, wherein the gate dielectric layer comprises a charge storage layer including a tunneling dielectric layer, a charge trapping layer and a blocking layer.

10. The three-dimensional memory structure of claim 9, wherein the charge storage layer comprises a silicon oxide layer as the tunneling dielectric layer, a charge-trapping multilayer including zirconium oxide (ZrO), silicon nitride (Si$_3$N$_4$) and silicon oxide (SiO$_2$), and an aluminum oxide layer (Al$_2$O$_3$) as the blocking layer.

11. The three-dimensional memory structure of claim 1, wherein the gate dielectric layer comprises a ferroelectric gate dielectric layer.

12. The three-dimensional memory structure of claim 11, further comprising an interfacial dielectric layer formed between the additional semiconductor layer and the ferroelectric gate dielectric layer.

13. The three-dimensional memory structure of claim 12, wherein the ferroelectric gate dielectric layer comprises a doped hafnium oxide layer and the interfacial dielectric layer comprises a high dielectric constant dielectric layer.

14. The three-dimensional memory structure of claim 1, wherein the conductive layer of each of the common source layer and the common drain layer comprises a metal layer.

15. The three-dimensional memory structure of claim 1, wherein the first isolation layer comprises a silicon oxide layer.

16. The three-dimensional memory structure of claim 1, further comprising a plurality of non-memory transistors formed in each NOR memory string, the non-memory transistors being designated as precharge transistors, the precharge transistors being activated during a precharge operation to electrically connect the common source layer and the common drain layer in each NOR memory string to set the voltage on the common source layer to equal to the voltage on the common drain layer.

17. The three-dimensional memory structure of claim 1, wherein the plurality of conductors forming the gate electrodes are provided in trenches formed between adjacent stacks of NOR memory strings, each conductor being spaced apart from an adjacent conductor by a dielectric filled shaft extending in the second direction.

18. The three-dimensional memory structure of claim 1, wherein the plurality of conductors in a first trench are formed offset in the first direction from the plurality of conductors in a second trench adjacent the first trench.

* * * * *